(12) United States Patent
Gao

(10) Patent No.: US 12,150,268 B2
(45) Date of Patent: Nov. 19, 2024

(54) CONTAINMENT SYSTEM FOR ELECTRONICS RACKS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 35 days.

(21) Appl. No.: 17/561,248

(22) Filed: Dec. 23, 2021

(65) Prior Publication Data

US 2023/0209760 A1    Jun. 29, 2023

(51) Int. Cl.
*H05K 7/14* (2006.01)
*H05K 7/20* (2006.01)

(52) U.S. Cl.
CPC ......... *H05K 7/1487* (2013.01); *H05K 7/1489* (2013.01); *H05K 7/1497* (2013.01); *H05K 7/20581* (2013.01)

(58) Field of Classification Search
CPC .. H05K 7/1487; H05K 7/1489; H05K 7/1497; H05K 7/20; H05K 7/20354; H05K 7/20581; H05K 7/18; H05K 7/183; H05K 7/186
See application file for complete search history.

(56) References Cited

U.S. PATENT DOCUMENTS

| | | | |
|---|---|---|---|
| 6,281,433 B1 * | 8/2001 | Decker | H05K 7/1425 174/394 |
| 7,729,116 B1 * | 6/2010 | Aybay | H05K 7/20736 361/679.48 |
| 8,184,435 B2 * | 5/2012 | Bean, Jr. | H05K 7/20745 361/679.48 |
| 8,320,120 B1 * | 11/2012 | Chan | H05K 7/20727 165/122 |
| 8,385,064 B1 * | 2/2013 | Smith | H05K 7/20727 361/679.48 |
| 8,701,737 B2 * | 4/2014 | Mainers | H05K 7/20709 160/1 |
| 8,873,236 B1 * | 10/2014 | Tamarkin | F04D 29/601 361/679.48 |
| 9,042,098 B2 * | 5/2015 | Campbell | H05K 7/20818 361/698 |
| 9,572,276 B2 * | 2/2017 | Haroun | H05K 7/1488 |
| 9,668,369 B2 * | 5/2017 | Cox | H05K 5/0217 |
| 9,888,606 B1 * | 2/2018 | Wendorf | H05K 7/20736 |
| 9,999,161 B2 * | 6/2018 | Mease | H05K 7/20727 |
| 10,206,303 B2 * | 2/2019 | Gustaferro | H05K 7/20745 |
| 11,246,231 B2 * | 2/2022 | Krietzman | H05K 5/0213 |

(Continued)

*Primary Examiner* — Adrian S Wilson
*Assistant Examiner* — Gage Crum
(74) *Attorney, Agent, or Firm* — WOMBLE BOND DICKINSON (US) LLP

(57) ABSTRACT

According to one embodiment, a containment system for an electronics rack that includes a top structure that is movably coupled on top of the electronics rack, a first side structure that is movably coupled to a first side of the electronics rack, and a second side structure that is movably coupled to a second side of the electronics rack that is opposite to the first side, each of the structures is arranged to move along an axis and at least partially beyond either a front end or a back end of the electronics rack creating a containment region that is at least partially surrounded by the top structure, the first side structure, and the second side structure.

20 Claims, 13 Drawing Sheets

(56) References Cited

U.S. PATENT DOCUMENTS

| | | | | |
|---|---|---|---|---|
| 2007/0076368 A1* | 4/2007 | Pike | G06F 1/20 | 361/679.48 |
| 2007/0146994 A1* | 6/2007 | Germagian | H05K 7/20745 | 361/695 |
| 2009/0277605 A1* | 11/2009 | VanGilder | G06F 1/20 | 454/184 |
| 2010/0061057 A1* | 3/2010 | Dersch | H05K 7/20745 | 29/592.1 |
| 2010/0307716 A1* | 12/2010 | Bean, Jr. | H05K 7/20745 | 165/80.2 |
| 2011/0181160 A1* | 7/2011 | Peng | H02B 1/301 | 312/223.1 |
| 2011/0226505 A1* | 9/2011 | Mackin | H05K 7/186 | 174/547 |
| 2011/0271610 A1* | 11/2011 | Cottuli | H05K 7/20745 | 52/173.1 |
| 2013/0029584 A1* | 1/2013 | Chan | H05K 7/20145 | 454/367 |
| 2013/0062037 A1* | 3/2013 | Rodriguez | H05K 7/20709 | 165/96 |
| 2013/0210335 A1* | 8/2013 | Krietzman | H05K 7/20745 | 454/184 |
| 2013/0233532 A1* | 9/2013 | Imwalle | F28F 27/02 | 165/287 |
| 2014/0301027 A1* | 10/2014 | Noteboom | H05K 7/20745 | 361/679.5 |
| 2015/0098186 A1* | 4/2015 | Alshinnawi | H05K 7/20736 | 361/679.58 |
| 2015/0208553 A1* | 7/2015 | Bauchot | F24F 11/30 | 165/251 |
| 2015/0259938 A1* | 9/2015 | Bernard | H05K 7/20736 | 52/64 |
| 2015/0305202 A1* | 10/2015 | Veino | H05K 7/20709 | 165/96 |
| 2017/0064858 A1* | 3/2017 | Cox | H05K 7/1488 | |
| 2018/0132385 A1* | 5/2018 | Gosselin | H05K 7/20745 | |
| 2021/0235599 A1* | 7/2021 | Illingworth | H05K 7/20727 | |
| 2023/0062182 A1* | 3/2023 | Karuppiah | H05K 7/20727 | |

* cited by examiner

CONTAINMENT SYSTEM FOR ELECTRONICS RACKS

FIELD

Embodiments of the present disclosure relate generally to a containment system for one or more electronics racks that creates a containment region for air cooling the one or more electronics racks.

BACKGROUND

Recently, data centers have been deploying more clusters of high-power density electronics racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs).

Thermal management for a data center that includes several active electronics racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is to liquid cool the IT equipment. For instance, equipment may include cold plates on which processors are mounted within the equipment. Cooling liquid is passed through the cold plates in order to transfer heat away from the active processors.

Another way to manage the thermal environment within a data center is to use cooling air to cool clusters of IT equipment. The cooling air is recirculated within the data center using a conventional aisle containment system with a data center air conditioner. These systems include clusters of IT equipment that are positioned between a cold aisle and a hot aisle. The cold aisle includes cold air that is drawn by the IT equipment to extract heat generated by the active IT equipment. This hot air is exhausted into a hot aisle that is separate from the cold aisle. The air conditioner draws in the hot air from the hot aisle, cools the hot air, and supplies the cooled air back into the cold aisle.

Conventional aisle containment systems, however, have drawbacks. For example, these systems are integrated into the data center, thereby defining which aisles are cold and which are hot. This means that the cooling capacity that is available for IT equipment within the data center is pre-defined, which although may be sufficient for some electronics racks may, however, provide insufficient cooling for high-power density electronics racks. This is due to the fact that these high-power racks produce more heat than racks of less density. Thus, there is a need for a containment system that is reconfigurable to provide different cooling containment solutions based on the air cooling needs of IT equipment contained within a data center.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
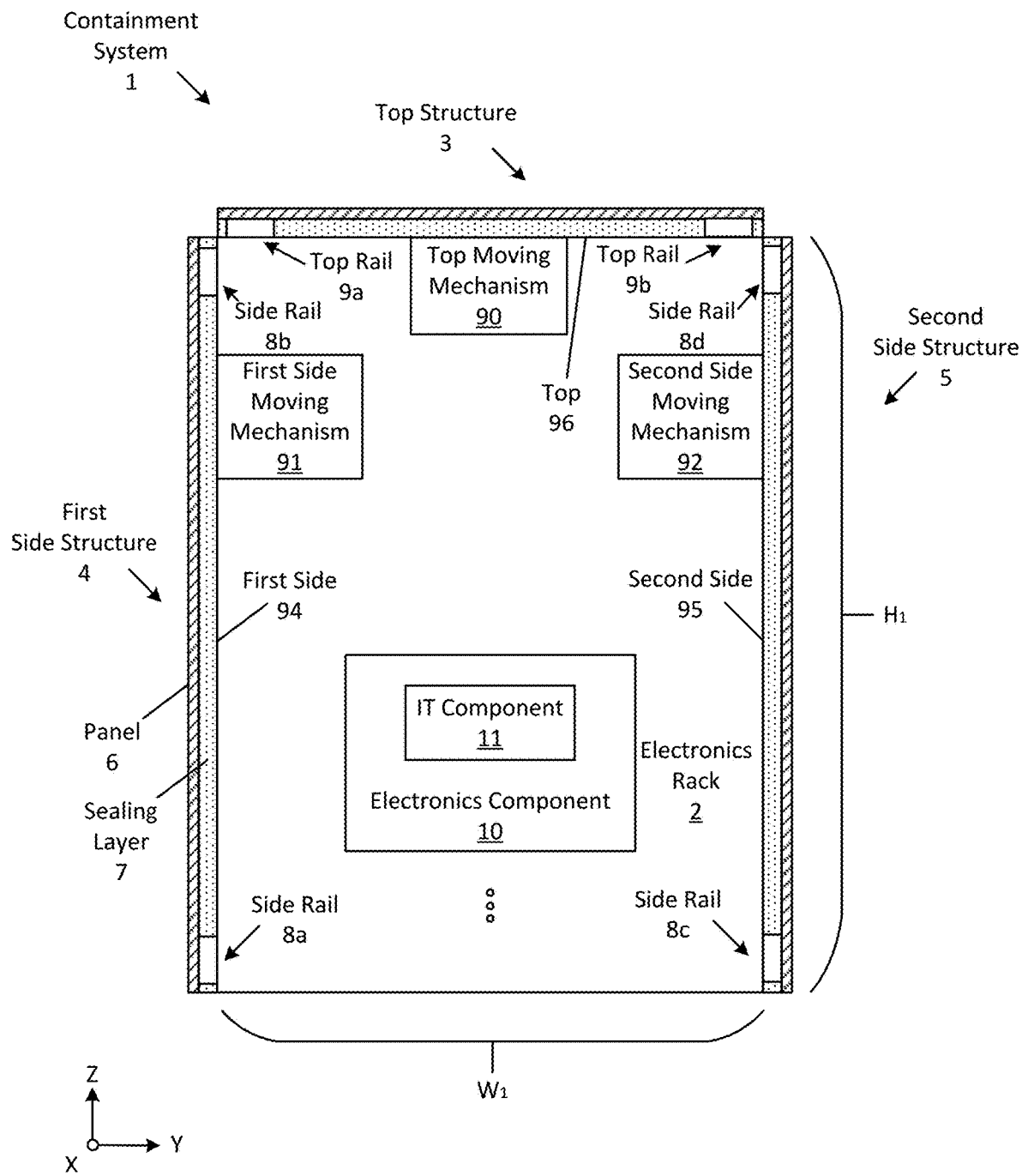
FIG. 1 shows a front view of an electronics rack with a containment system according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of providing efficient and effective air cooling containment solutions that are scalable. Specifically, the present disclosure describes a containment system that may be integrated with existing clusters of electronics racks that is able to reconfigure an air cooling containment layout based on changing air containment needs. For example, some clusters of electronics racks that are deployed adjacent to each other may require different thermal environments, which may be based on the electronics mounted within the rack. As a result, the present disclosure allows air containment regions between the clusters of racks to be reconfigured in order to adjust which clusters of adjacent racks share the same thermal environment. To do this, the present disclosure describes a containment system for one or more electronics racks, such as a cluster of electronics racks arranged in a row, that includes a top structure that is movably coupled on top of the cluster of electronic rack, a first side structure that is movably coupled to one side of the cluster of electronics racks (e.g., coupled to a side of an electronics rack at one end of the cluster), and a second side structure that is movably coupled to another side of the cluster of electronics racks (e.g., coupled to a side of an electronics rack that is at an opposite side of the row of racks). Thus, the top structure is disposed on top of the cluster, whereas the two side structures are disposed on transverse sides of the cluster of racks. This configuration allows a containment region to be created either towards a front end or a back end of the cluster of electronics racks. In particular, each of the structures is arranged to move along an axis (e.g., running along a transverse axis of the cluster of racks) and at least partially beyond either the front end or the back end of the racks, creating a containment region either in front of or behind the cluster of racks when the structures either come into contact with an adjacent row of electronics racks or adjacent structures that are coupled to the adjacent row.

According to one embodiment, a containment system for an electronics rack, the containment system including a top structure that is movably coupled on top of the electronics rack; a first side structure that is movably coupled to a first side of the electronics rack; and a second side structure that is movably coupled to a second side of the electronics rack that is opposite to the first side, each of the structures is arranged to move along an axis and at least partially beyond either a front end or a back end of the electronics rack creating a containment region that is at least partially surrounded by the top structure, the first side structure, and the second side structure.

In one embodiment, the containment system further includes a first set of rails that are coupled to the top of the electronics rack and to which the top structure is movably coupled; a second set of rails that are coupled to the first side of the electronics rack and to which the first side structure is movably coupled; and a third set of rails that are coupled to the second side of the electronics rack and to which the second side structure is movably coupled, where each of the structures is arranged to move by sliding linearly along its respective set of rails, in another embodiment, the top structure includes a panel that extends at least along a width of the electronics rack, and each of the first and second side structures includes a panel that extends along a height of the electronics rack.

In one embodiment, the top structure includes at least one fan that is arranged to push air into or out of the containment region. In another embodiment, the axis is a first axis, where the at least one fan is arranged to rotate about a second axis that is perpendicular to the first axis to change a direction towards which the at least one fan pushes the air. In some embodiments, the top structure further includes at least one cooling unit that is arranged to produce cooled air from ambient air that is pulled from outside of the containment region by the at least one fan, where the cooled air is pushed into the containment region by the at least one fan.

According to another embodiment, a cluster of electronics racks that are arranged in a row, the cluster of electronics racks including a top structure that is disposed on top of the cluster of electronics racks and is movably coupled on at least one of the electronics racks; a first side structure that is movably coupled to a side of a first electronics rack that is positioned at one end of the row; and a second side structure that is movably coupled to a side of a second electronics rack that is positioned at another end of the row that is opposite to the one end, where each of the structures is arranged to move along an axis and at least partially beyond either a front end or a back end of the cluster of electronics racks creating a containment region that is at least partially surrounded by the top structure, the first side structure, and the second side structure.

In one embodiment, the cluster of electronics racks further includes a first set of rails that are coupled to the top of the at least one of the electronics racks and to which the top structure is movably coupled; a second set of rails that are coupled to the side of the first electronics rack and to which the first side structure is movably coupled; and a third set of rails that are coupled to the side of the second electronics rack and to which the second side structure is movably coupled, where each of the structures is arranged to move by sliding linearly along its respective set of rails. In another embodiment, the top structure includes a panel that extends at least along a width of the row, where each of the first and second side structures includes a panel that extends along a height of its respective electronics rack to which it is movably coupled.

In one embodiment, the top structure includes at least one fan that is arranged to push air into or out of the containment region. In another embodiment, the axis is a first axis, where the at least one fan is arranged to rotate about a second axis that is perpendicular to the first axis to change a direction towards which the at least one fan pushes the air. In some embodiments, the top structure further includes at least one cooling unit that is arranged to produce cooled air from ambient air that is pulled from outside the containment region by the at least one fan, wherein the cooled air is pushed into the containment region by the at least one fan, According to another embodiment, a data center includes a data center information technology (IT) room; a cluster of electronics racks that are disposed within the data center IT room and are arranged in a row; and a containment system, which is similar to the containment system as previously described.

In one embodiment, the cluster of electronics racks is a first cluster of electronics racks, where the data center further comprises a second cluster of electronics racks that are disposed within the data center IT room and are arranged in a second row that runs parallel and adjacent to the first cluster of electronics racks, each of the top, first side, and second side structures is arranged to move along the axis and towards the second cluster of electronics racks such that the containment region is at least partially surrounded by the first and second cluster of electronics racks and each of the top, first side, and second side structures.

In another embodiment, the top structure is a first top structure, the containment system is a first containment system, the data center further includes a second containment system that includes: a second top structure that is disposed on top of the second cluster of electronics racks and is movably coupled on at least one of the electronics racks of the second cluster; a third side structure that is movably coupled to a side of a third electronics rack that is positioned at the one end of the second row; and a fourth side structure that is movably coupled to a side of a fourth electronics rack that is positioned at the another end of the second row that is opposite to the one end, where 1) the first top structure, the first side structure, and the second side structure are arranged to move along the axis towards the second cluster of electronics racks and 2) the second top structure, the third side structure, and the fourth side structure are arranged to move along the axis towards the first cluster of electronics racks such that the first top structure, the first side structure, and the second side structure come into contact with the second top structure, the third side structure, and the fourth side structure, respectively, creating the containment region that is surrounded by the first and second clusters of electronics racks and all of the structures.

In one embodiment, as used herein, "to couple" one component (or element) to another component may refer to "fluidly" coupling the two components so that a fluid (or liquid), such as a cooling liquid or a liquid coolant may flow between the two components. For example, coupling a first tube to a second tube may couple both tubes together such that liquid coolant may flow from the first tube into the second tube (and/or vice a versa).

FIG. 1 shows a front view of an electronics rack with a containment system according to one embodiment. Specifically, this figure shows a front end (e.g., front end 12 of FIG. 2) of an electronics rack 2 that includes an electronics component 10 and a containment system 1, which hereafter may be referred to as "system". In one embodiment, the electronics component 10 may be housed (or contained) within (e.g., a housing or frame of) the electronics rack. For instance, the electronics component may be mounted (e.g., coupled to one or more rack rails (or brackets)) within the rack. For instance, the electronic rack may include one or more (server) slots that are each designed to contain (or house) one or more electronics components. In addition, as shown, the electronics component includes an information technology (IT) component 11 (e.g., one or more processors such as central processing units (CPUs) and/or graphical processing units (GPUs), memory, and/or storage devices). In one embodiment, the electronics component may include one or more IT components (e.g., mounted therein), In some embodiments, IT components may perform data processing tasks, where an IT component may include software installed in a storage device, loaded into the memory, and executed by one or more processors to perform the data processing tasks. In one embodiment, the electronics component may be any type of electronics equipment that may include one or more IT components (and may have one or more liquid cooling components for cooling the electronics component). For example, the electronics component may include an electronics board (e.g., a server printed circuit board (PCB)), to which one or more IT components are mounted. In another embodiment, the electronics component may include a cloud server that is configured to perform cloud-based data processing, In another aspect, the electronics component may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs or different types of accelerators) managed by the host server. In another embodiment, when the electronics rack includes two or more electronics components, each component may perform similar (or different) operations than other components contained therein. In one embodiment, when the IT component (e.g., processor) performs computational tasks, the component may generate heat. In some embodiments, the electronics component may be air-cooled to transfer the generated heat away from the IT components and into the ambient air that passes over the (e.g., electronics component of the) IT component. In another embodiment, the (e.g., IT component of the) electronics component may include liquid cooling components (e.g., having a cold plate, such as plate 99 shown in FIG. 11, coupled to the IT component) to provide liquid cooling.

Also shown are several (e.g., external) dimensions of (e.g., the frame that makes up) the electronics rack 2. For instance, the electronics rack has a width (along the Y-axis), $W_1$, and a height (along the Z-axis), $H_1$. In one embodiment, these dimensions may be similar to dimensions of any type of electronics rack, such as a 42U rack, In the case in which rack 2 is a 42U rack, $H_1$ may he approximately 80 inches, $W_1$ may he approximately 19 or 21 inches, and the electronics rack may have a depth (e.g., $D_1$ shown in FIG. 2) of approximately 40 inches. In another embodiment, the electronics rack may have different dimensions (e.g., in order to accommodate any sized and/or amount of electronics components, such as a server blade and/or to accommodate size requirements of a data center in which the rack may be housed).

The containment system 1 is configured to create a containment region (e.g., an area within an environment) that is about the electronics rack in order to manage air flow (and/or air circulation) through the (e.g., data center that houses the electronics rack and the) electronics rack. The system includes three structures: a top structure 3, a first (right) side structure 4, and a second (left) side structure 5, where each of these structures are disposed outside and about (e.g., on) the (housing of the) rack. In particular, each of these structures is (e.g., movably) coupled to the electronics rack. Specifically, the top structure 3 is coupled to a top (side) 96 of the rack, the first side structure 4 is coupled to a first side 94 of the rack, and the second side structure 5 is coupled to a second side 95 of the rack.. In one embodiment, the first side and the second side may be opposite sides with respect to the rack, such as the first side being a right side of the rack and the second side being a left side of the rack. As described herein, the containment region is created when (at least some of) the structures are moved beyond (either a front end or a back end of) the electronics rack, thereby creating a movable housing (or shell) that surrounds a portion of space that is adjacent to the rack. Thus, the containment system is (at least partially) sealing (or partitioning) off air from inside the region from a remainder of the environment, thereby allowing the system to manage airflow into and/or out of the electronics rack. More about how these structures are coupled to the electronics rack and about the containment region is described herein.

Each of these structures of the containment system 1 includes a (top) panel (or layer) 6 and a sealing layer 7. As shown, the sealing layer is disposed below and coupled to a bottom (surface) of the panel 6. In one embodiment, both of these elements may he removeably coupled to one another. In another embodiment, the top panel and the sealing layer may be one integrated unit. In another embodiment, the sealing layer may be (e.g., removeably) coupled to (e.g., a top surface) of the electronics rack. In some embodiments, the sealing layer may be fixed to (e.g., integrated with) the rack top surface. The panel may comprise any type of material, such as aluminum, stainless steel, and/or one or more polymers (e.g., plastic, etc.). The sealing layer may comprise an insulating material, such as rigid fiber or fibrous board. In another embodiment, the sealing layer may comprise any material, such as any of the materials described herein with respect to the panel.

In one embodiment, the sealing layer 7 is arranged to prevent air from flowing into (and/or out of) a containment region created by the containment system, as described herein. To do this, the sealing layer is disposed between the panel and a (e.g., outer surface of a respective) side of the electronics rack. For example, the sealing layer 7 of the first side structure 4 is disposed between the panel 6 of the structure 4 and the first side 94 (e.g., an external surface of this side) of the electronics rack. Thus, the sealing layer is adjacent to the external surface of this side, Iii one embodiment, the sealing layer may at least partially come into contact with the surface in order to create a (e.g., better) seal for the containment region. More about the containment region is described herein. In another embodiment, the sealing layer may reduce airflow between the containment region and the ambient environment (e.g., the environment outside the region, such that a remainder of a data center IT room 31 shown in FIG. 5a that is outside containment regions 34a and 34b), but may not completely (or fully) seal the region off from the ambient environment. For example, the sealing layer may be arranged such that there is at least some open space (e.g. between a respective structure and the rack), such that (at least some) air may flow between the containment region and the ambient environment. In one embodiment, the created containment region may only be partially sealed off in order to prevent pressure from inside the region from exceeding (or dropping below) a predefined threshold due to air flowing into and out of the containment region. Thus, the region may be sealed such that an internal pressure of the region within remains below (or above) the threshold.

Figure 2:
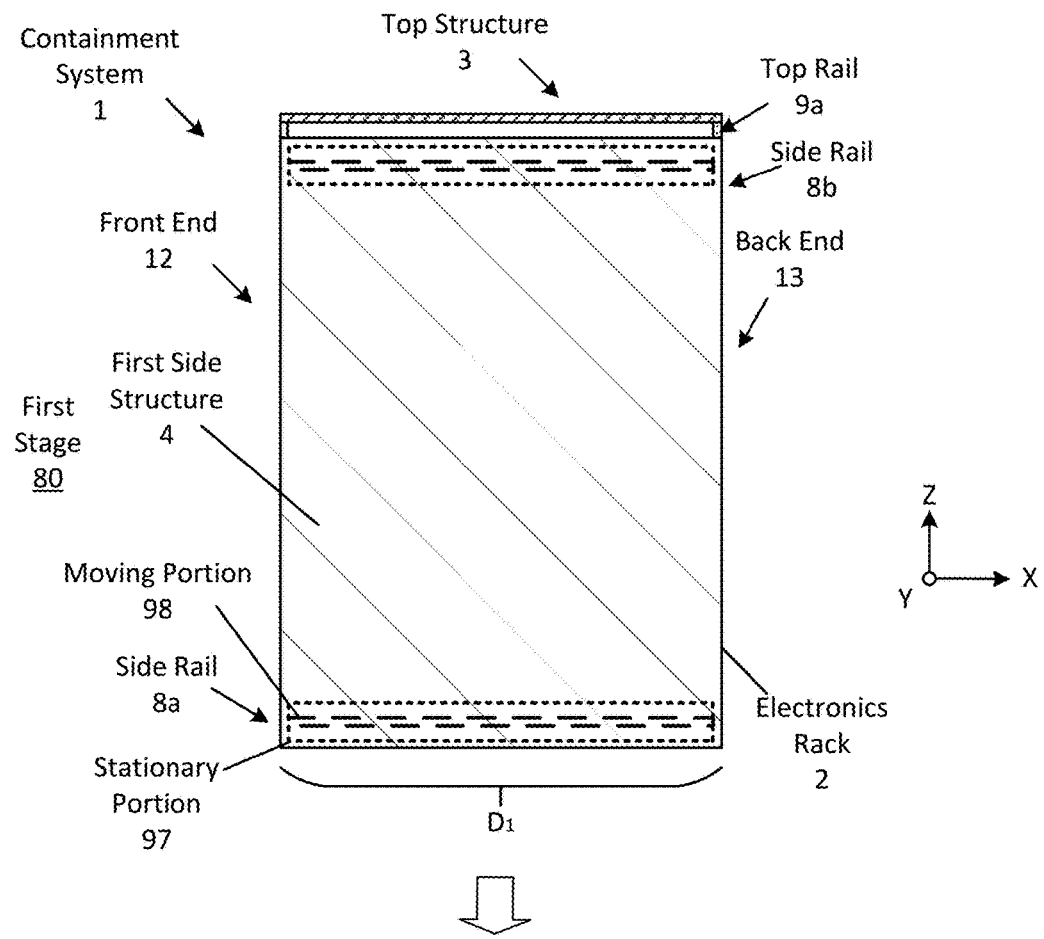
FIG. 2 shows several stages of a side view of the electronics rack with the containment system in which structures is moved towards a back end of the electronics rack according to one embodiment.
Figure 2:
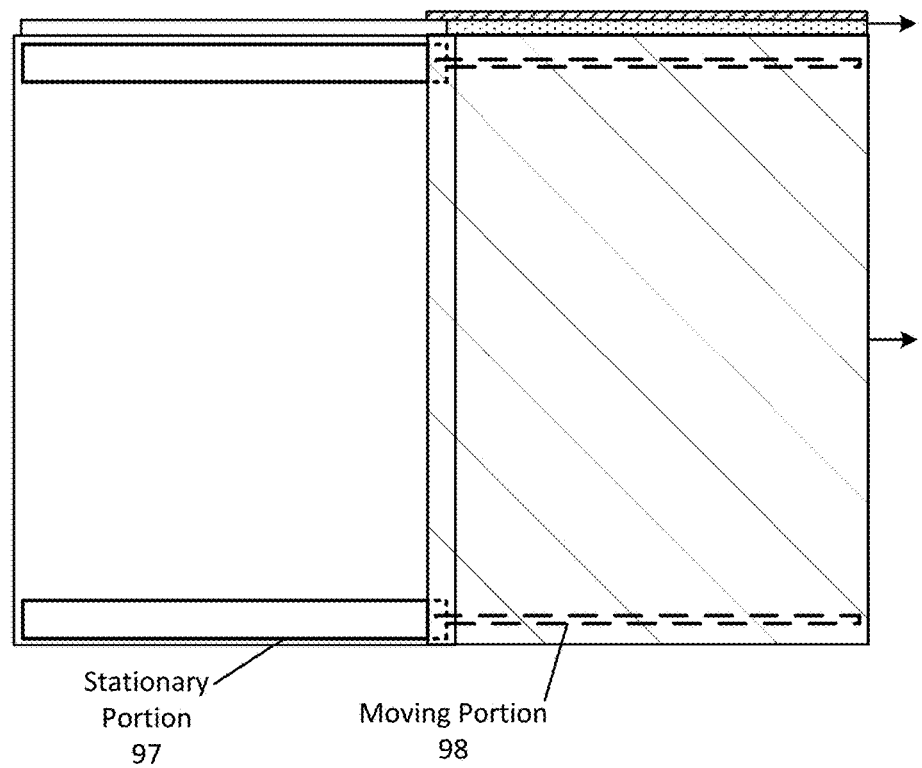

In one embodiment, the structures may have at least some similar dimensions as their respective sides of the rack to which they are coupled. For example, the first and/or second side structures 4 and 5 may have a height of (approximately) $H_1$, and the top structure 3 may have a width of (approximately) $W_1$. Thus, the structures may have similar (or the same) dimensions as the sides to which they are coupled. In another embodiment, one or more of these dimensions may be different, such as the top structure 3 having a width that is greater than $W_1$, as shown in FIG. 2. More about the dimensions of the structures is described herein.

The system 1 includes one or more rails that are arranged to couple one or more structures to the electronics rack 2. The rails are (at least partially) disposed outside and coupled to the rack. Specifically, the system includes three sets of one or more rails. instance, the system includes a first set of two top rails 9a and 9b that are coupled to the (external surface of the) top 96, a second set of two side rails 8a and 8b that are coupled to the first side 94, and a third set of two side rails 8c and 8d that are coupled to the second side 95. Each set of rails are positioned at either ends of their respective side. For instance, top rail 9a is at one end of the top 96 that is adjacent to the first side 94, and the top rail 9b is at an opposite end of the top 96 that is adjacent to the second side 95. The side rails are positioned similarly with respect to their respective sides to which they are coupled. In particular, side rail 8b is at one end of the first side 94 that is adjacent to the top 96 and side rail 8a is at an opposite end of the first side that is adjacent to a bottom of the rack. Side rails 8c and 8d are positioned similarly about the second side 95, as shown. In one embodiment, any of the sides and/or top may have any number of rails in any configuration. As one example, the top may include more than two rails, or may not include any rails at all. In another embodiment, the rails may be positioned differently, such as a rail coupled along a center of its respective structure (e.g., rail 8a may be coupled to the first side at a half-way point along $H_1$).

In one embodiment, the rails may be removeably coupled to the (e.g., frame of the) electronics rack using any type of hardware (e.g., fasteners, such as bolts). In some embodiments, the rails may be designed to couple to existing (standard) electronics racks that are contained within data centers. As a result, the containment system may be added (or removed) to (e.g., a standard) electronics racks within existing data centers. In another embodiment, the rails may be a part of (or integrated with) their respective sides.

Each of the structures 3-5 are movably coupled to the electronics rack, via its respect one or more rails. As shown, the panels of each of the structures is coupled to the structure's associated rails. For example, the panel 6 of the first side structure 4 is coupled to side rails 8a and 8b, which are coupled to the first side 94. In one embodiment, the sealing layer may have a thickness (along the Y-axis) that is approximately equal to a thickness of the rail. Thus, the sealing layer may reduce (or eliminate) empty space between the top surface of the sides of the rack and a bottom surface of the panel, due to the thickness of the rail. In another embodiment, the rails may be disposed between their respective structure and the side to which the rails couple the structure. In this case, the rails may be coupled to the sealing layer of their respective structure. As described herein, each of the structures may be arranged to move along an axis (e.g., the X-axis), via its respective rails. More about the structures moving along their respective rails is described herein.

The system also includes several moving mechanisms 90-92 that are configured to automatically (e.g., without user intervention) move their respective structure (e.g., along the structure's rails). For example, each of the mechanisms may comprise one or more motors (or actuator) that are configured to move a structure along its respective rails. In particular, the top moving mechanism 90 may be configured to move the top structure 3 along top rails 9a and 9b, the first side moving mechanism 91 may be configured to move the first side structure 4 along side rails 8a and 8b, and the second side moving mechanism 92 may be configured to move the second side structure 5 along side rails 8c and 8d. In another embodiment, each of the mechanisms may include one or more pulley mechanisms that are configured to pull structures along their respective rails. In another embodiment, the mechanisms may be any type of device that is designed to pull or push the structures along their respective rails. As shown, each of the mechanisms is within the electronics rack. In another embodiment, the mechanisms may be housed differently, such as being a part of (and/or housed within) one or more of the rails. As another example, one or more mechanisms may be a part of (coupled to) one or more structures (e.g., top mechanism 90 being coupled to the top structure 3).

In one embodiment, each of the moving mechanisms may be communicatively coupled (e.g., coupled via a wired and/or wireless connection) to one or more controllers that is configured to perform containment operations to create a containment region with the containment system 1. For example, the controller may transmit one or more control signals to one or more of the moving mechanism, which in response may actuate (e.g., one or more motors or actuators) to cause their respective structures to move (or slide) along one or more rails. In one embodiment, the controller may transmit the control signals in response to receiving user input (e.g., via a user input device that is communicatively coupled to the controller). In one embodiment, the controller may be housed (e.g., as the electronics component 10) within the electronics rack 2. In another embodiment, the controller may be configured to control one or more structures of multiple (e.g., clusters of) electronics racks to create one or more regions.

FIG. 2 shows several stages 80 and 81 of a side view of the electronics rack 2 (e.g., of FIG. 1) with the containment system 1 in which structures are moved towards a back end 13 of the electronics rack according to one embodiment. Specifically, this figure is showing a side view of the first side structure 4 and the top structure 3 that are (movably) coupled to the electronics rack 2. This view also shows the depth, $D_1$, of the electronics rack that extends from the front end 12 of the rack to the back end 13. As described herein, the structures may have similar dimensions as the rack. In particular, this figure shows that the first side structure 4 and the top structure 3 have (e.g., approximately) the depth (e.g., length in the X-direction) of $D_1$. In one embodiment, although not shown, the second structure 5 may have similar dimensions, Thus, the three structures 3-5 may cover (or at least partially cover) their respective sides to which they are attached. In another embodiment, one or more of the structures may have a depth that is different (e.g., less) than $D_1$, More about the depth of the structures is described herein.

Also shown are the side rails 8a and 8b that are (movably) coupling the first side structure 4 to the (first side 94 of the) electronics rack, and the top rail 9a that is (movably) coupling the top structure 3 to the (top 96 of the) rack. Each of these rails extend along $D_1$ of the electronics rack. In one embodiment, the rails (or at least some of the rails) may have a length in the X-direction that is less than $D_1$.

In one embodiment, each of the rails may include one or more components. For example, each of the side rails include a stationary portion 97 and a moving portion 98. In one embodiment, the stationary portion may be a rail or track that is removeably coupled to (e.g., a respective side of) the electronic rack, while the moving portion is movably coupled to the stationary portion in order to allow a structure that is mounted on the moving portion to move (e.g., along the X-axis) with respect to the stationary portion (e.g., and the rack). For example, the stationary portion 97 of the side rail 8a may be fixed to (e.g., and abutting the external surface of) the first side 94, while the moving portion 98 of the rail 8a may be movably coupled to the stationary portion and be (e.g., removeably) coupled to (e.g., a back side of) the first side structure 4.

In one embodiment, the rails may be any type of rail that at least allows structures coupled to move in at least one direction with respect to the electronics rack. For example, a structure of the containment system 1 may be arranged to move by (the moving portion coupled to the structure) sliding linearly along its stationary portion. For example, one or more of the rails may be linear bearing rails, where the moving portion includes one or more ball bearings that slide (or roll) along (e.g., a track a the stationary portion to move in the X-direction (e,g., towards the back end 13 of the rack and/or towards the front end 12 of the rack). In another embodiment, the rails may be rolling rails, where the stationary portion includes one or more wheels along which the moving portion moves. In addition to (or in lieu of) the stationary portion including one or more rails, the moving portion may include one or more wheels that are arranged to roll along the stationary portion. In another embodiment, the rails may be any type of rails that are able to move the structures in at least one direction (with respect to the electronics rack).

The first stage 80 shows that the (e.g., the structures 3 and 4 of the) containment system is in a "stored" position in which no portion of the structures of the system (or at least a small portion of the structures that is less than a threshold) extends beyond (e.g., the front end 12 and/or the back end 13) the electronics rack. As shown, the edges of structures 3 and 4 (and structure 5, which is not shown) are aligned with corresponding edges of the rack. For example, the edges of the top structure 3 (e.g., edges that run along the Y-axis) are aligned with the corresponding edges of the top 96. In another embodiment, when a structure has a depth that is less than $D_1$, the structure is in the stored position while the structure is disposed (e.g., entirely) above its respective side. In another embodiment, while in this stored position a structure is not being used to create a containment region that is at least partially surrounded by the structure (and/or other structures and/or the electronics rack).

The second stage 81 shows that the structures of the containment system are in their "extended" positions in which (at least some of) the structures of the system are creating a containment region. Specifically, the first side structure 4 and the top structure 3 have moved to extend beyond the back end 13 of the electronics rack to create a containment region that is at least partially surrounded by the top structure 3 and the first side structure 4. In one embodiment, the second side structure 5 may have also extended outward in order for all three structures to create a region that is surrounded by each of the structures (and the back end 13 of the electronics rack). Thus, each of the structures is arranged to move along the X-axis by sliding along their respective rails to create the containment region about the rack. In some embodiments, the structures may be arranged to extend a length beyond edges of the electronics rack that is equal to or less than $D_1$ of the structures.

In one embodiment, at least some of the structures may be arranged to move in any direction along the:-axis, In particular, the structures may move beyond the back end 13 of the rack and/or move beyond the front end 12 of the rack. This allows the containment system to create the containment region that is at the front end 12 of the rack or is at the back end 13 of the electronics rack, as shown in this figure.

As described thus far, each side 94-96 of the electronics rack 2 includes one structure of the containment system 1. In another embodiment, one or more sides of the electronics rack may include one or more structures. For example, the first side 4 may include two structures that are coupled to the side rails 8a and 8b, and are arranged to move in one or more directions. In particular, the first side 94 may have one side structure that is arranged to move towards the front end 12 of the rack, and have another side structure that is arranged to move towards the back end. 13 of the rack. In some embodiments, each structure coupled to the side may share (or be coupled to a shared) rail, and/or may be movably coupled to the side via separate rails.

Figure 3:
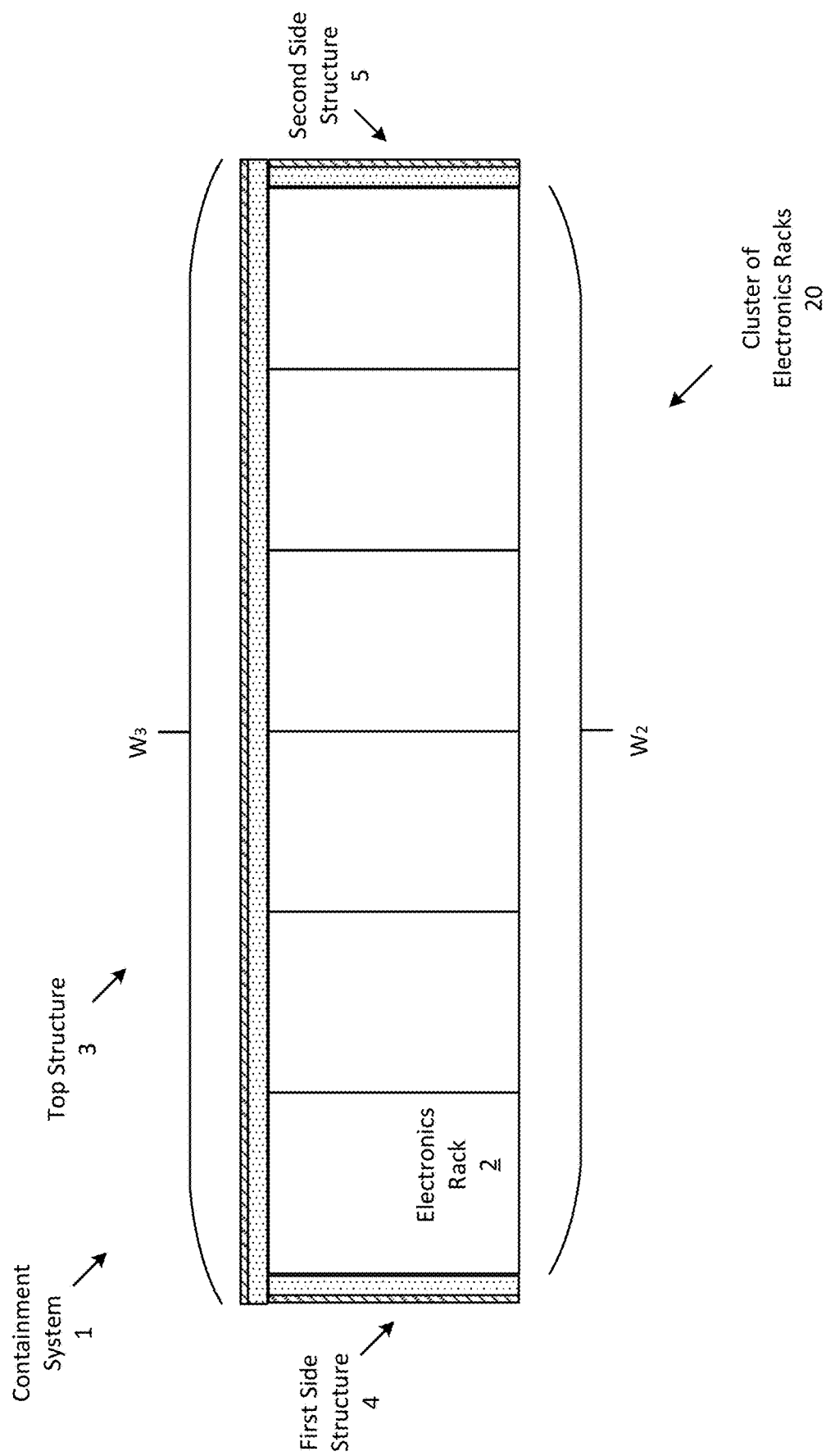
FIG. 3 shows a front view of a cluster of electronics racks arranged in a row with the containment system according to one embodiment.

As described thus far, the containment system 1 may be arranged to create a containment region about a single electronics rack to which structures of the system are coupled. In another embodiment, the containment system may create the containment region for one or more electronics racks, such as a cluster of (one or more) electronics racks that are arranged in a row. FIG. 3 shows such an example in which the containment system 1 is coupled to a cluster of (one or more) racks. Specifically, this figure shows a front view of a cluster of electronics racks 20 arranged in a row with the containment system 1 according to one embodiment. As shown, the cluster of racks 20 includes six electronics racks 2 arranged in a row in which at least one side of each rack is adjacent to an opposite side of one or more other racks.

The structures 3-5 of the containment system 1 are arranged to create a containment region that is surrounded by the structures and the row of electronics racks (e.g., the front ends 12 of each of the racks or the back ends 13 of each of the racks). For example, the first side structure 4 is movably coupled to a side (e.g., the first or right side) of the electronics rack that is positioned at one end of the row of racks, while the second side structure 5 is movably coupled to a side (e.g., the second or left side) of the electronics rack that is positioned at another end of the row or racks that is opposite to the one end. Specifically, the first side structure is coupled to the right side of one electronics rack, while the second side structure is coupled to the left side of another electronics rack, The top structure 3 is disposed on top of the cluster of electronics racks 20. In one embodiment, the top structure may be movably coupled on at least one of the six electronics racks. For example, the top structure may be movably coupled to the tops of each of the electronics racks via one or more top rails (e.g., 9a and/or 9b). In another embodiment, the top structure may be coupled to only some of the electronics racks. For instance, the top structure 3 may be coupled to only the two electronics racks at the end of the row (e.g., the rack coupled to the first side structure 4 and the rack coupled to the second side structure 5). As a result, the top structure may be disposed above the four electronics racks in between the racks on either end without being (directly) coupled to these middle racks. In another embodiment, the top structure may float above (e.g., not come into contact with) these middle racks.

As shown, the top structure 3 may extend beyond the width of the row of electronics racks, For instance, the row of racks may have a width of $W_2$, which may be equal to or greater than $6 \times W_1$. The top structure 3, on the other hand, has a width of $W_3$, which extends beyond $W_2$. In particular, $W_3$ extends between the top surfaces of the first side structure 4 and the top surface of second side structure 5. By the top structure hanging over the width of the row of racks and the two side structures, the containment system may create a better seal between the top structure and both side structures 4 and 5. In another embodiment, $W_3$ may equal $W_2$.

Figure 4:
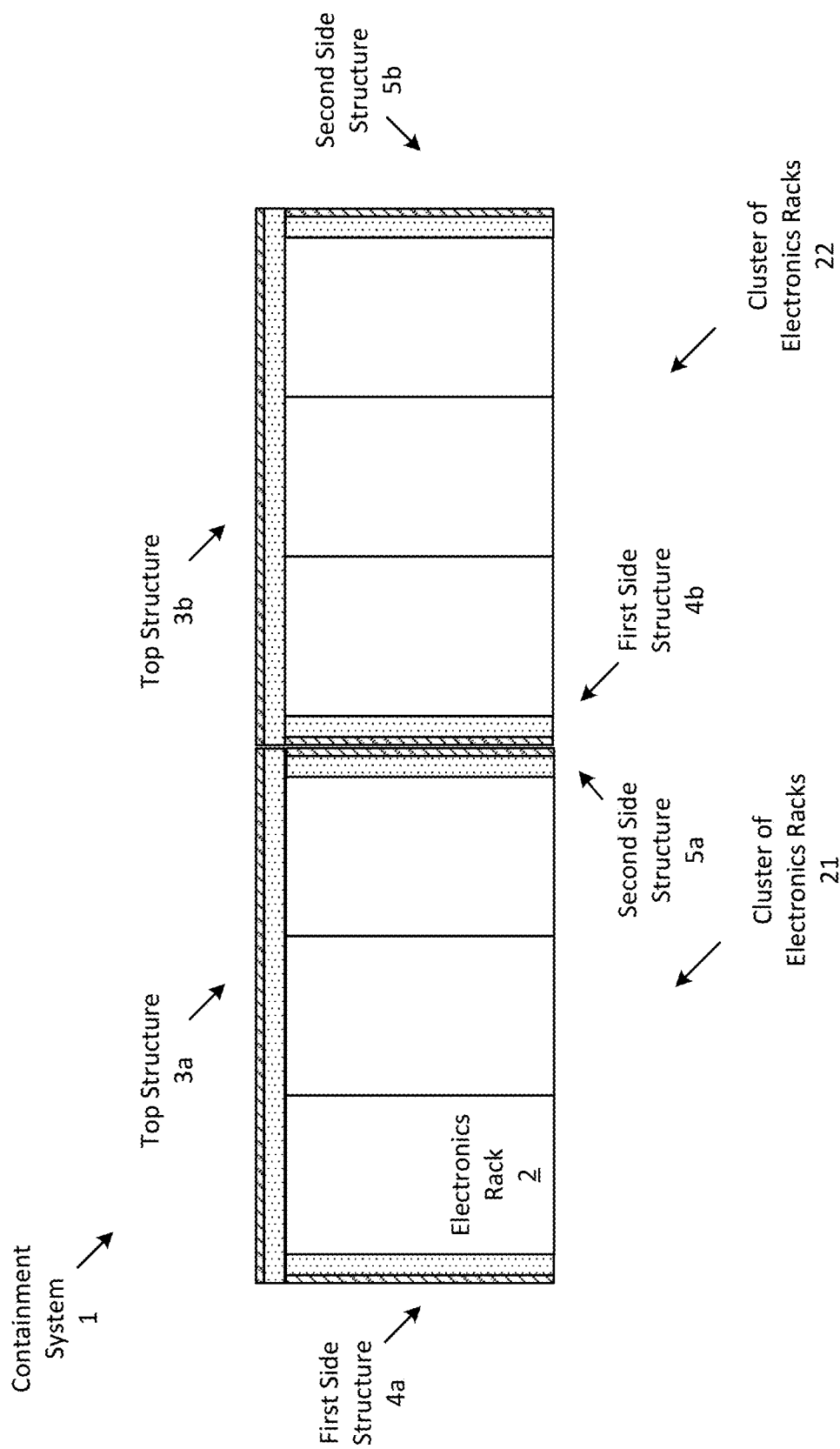
FIG. 4 shows a front view of two clusters of electronics racks arranged in adjacent rows with the containment system according to one embodiment.

FIG. 4 shows a front view of two clusters of electronics racks with the containment system according to one embodiment. Specifically, this figure shows two clusters of electronics racks 21 and 22, each including three electronics racks, where both clusters are arranged in a row of six electronics racks (e.g., two rows of three racks that are next to or adjacent to each other). The containment system includes several structures in order to create multiple (e.g., separate) containment regions about the clusters of racks, In particular, the containment system may create multiple containment regions by adding at least one or more additional side structures between two adjacent electronics racks of the cluster of racks (e.g., the cluster 20 shown in FIG. 3). For example, the cluster 21 includes a first side structure 4a coupled to one rack in the cluster that is disposed at one end, a second side structure 5a coupled to another rack in the cluster that is disposed at an opposite end, and a top structure 3a disposed on top of the three racks in the cluster 21. The cluster 22 includes a first side structure 4b coupled to one electronics rack in the cluster that is disposed one end, a second side structure 5b coupled to the another electronics rack in the cluster that is disposed at an opposite end, and a top structure 3b disposed on top of the three racks in the cluster 22. As a result, one containment region may be created for the first three racks of cluster 21 and a separate containment region may be created for the second three racks of cluster 22. In one embodiment, the structures may be independently controlled, such that containment regions may be created along either the same side of the racks (e.g., both regions towards a front end), or may be created at opposite ends (e.g., where one region is created about a front end of the racks of cluster 21 and the other region is created about a back end of the racks of cluster 22).

In one embodiment, the adjoining clusters 21 and 22 may share one or more structures. For example, both clusters may share a top structure (e.g., the top structure shown in FIG. 2). As a result, one top structure may be disposed on top of all six electronics racks of both clusters.

Figure 5A:
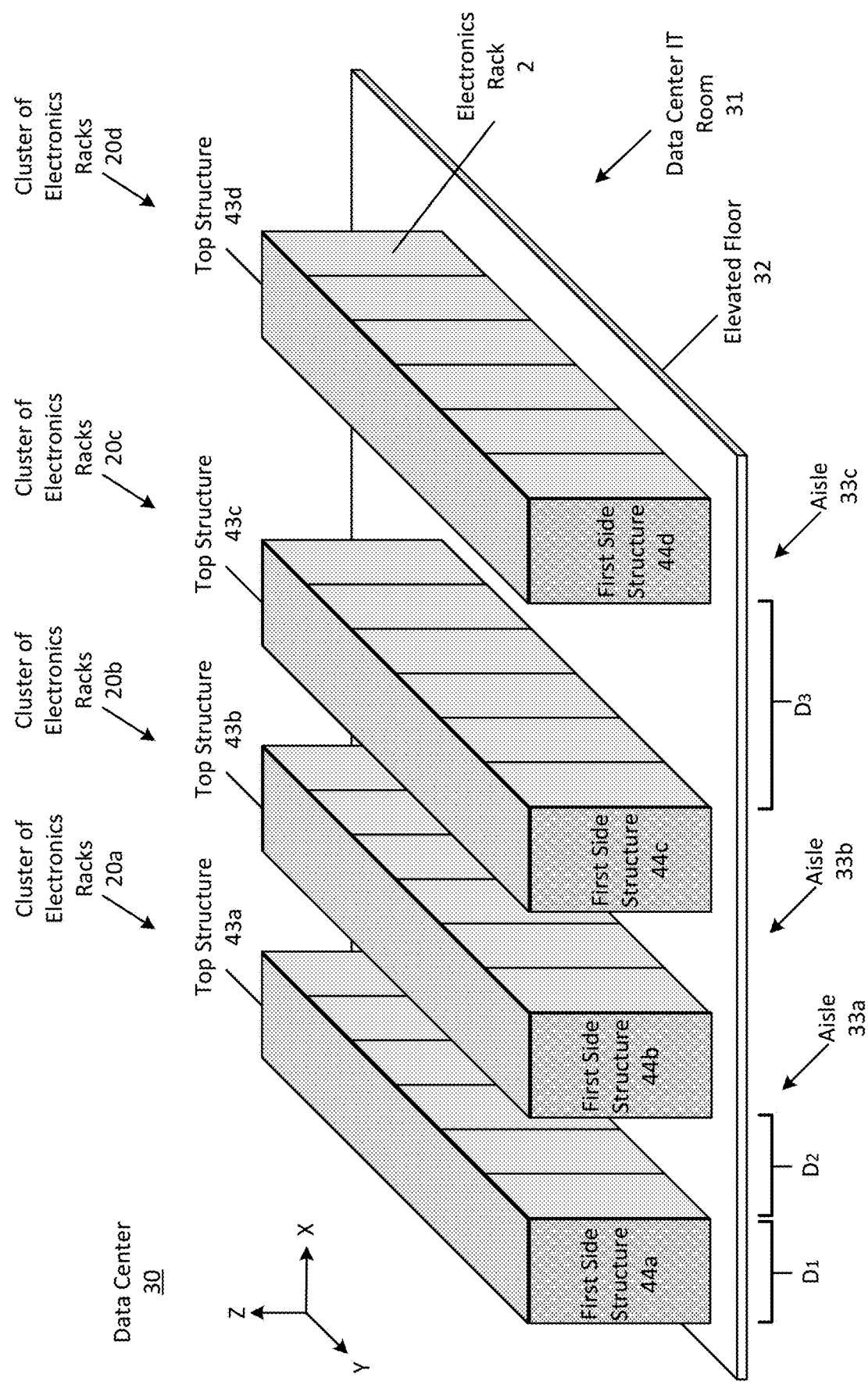
FIGS. 5a-5c show perspective views of a data center that includes several clusters of electronics racks with containment systems that are used to create containment regions according to one embodiment.
Figure 5B:
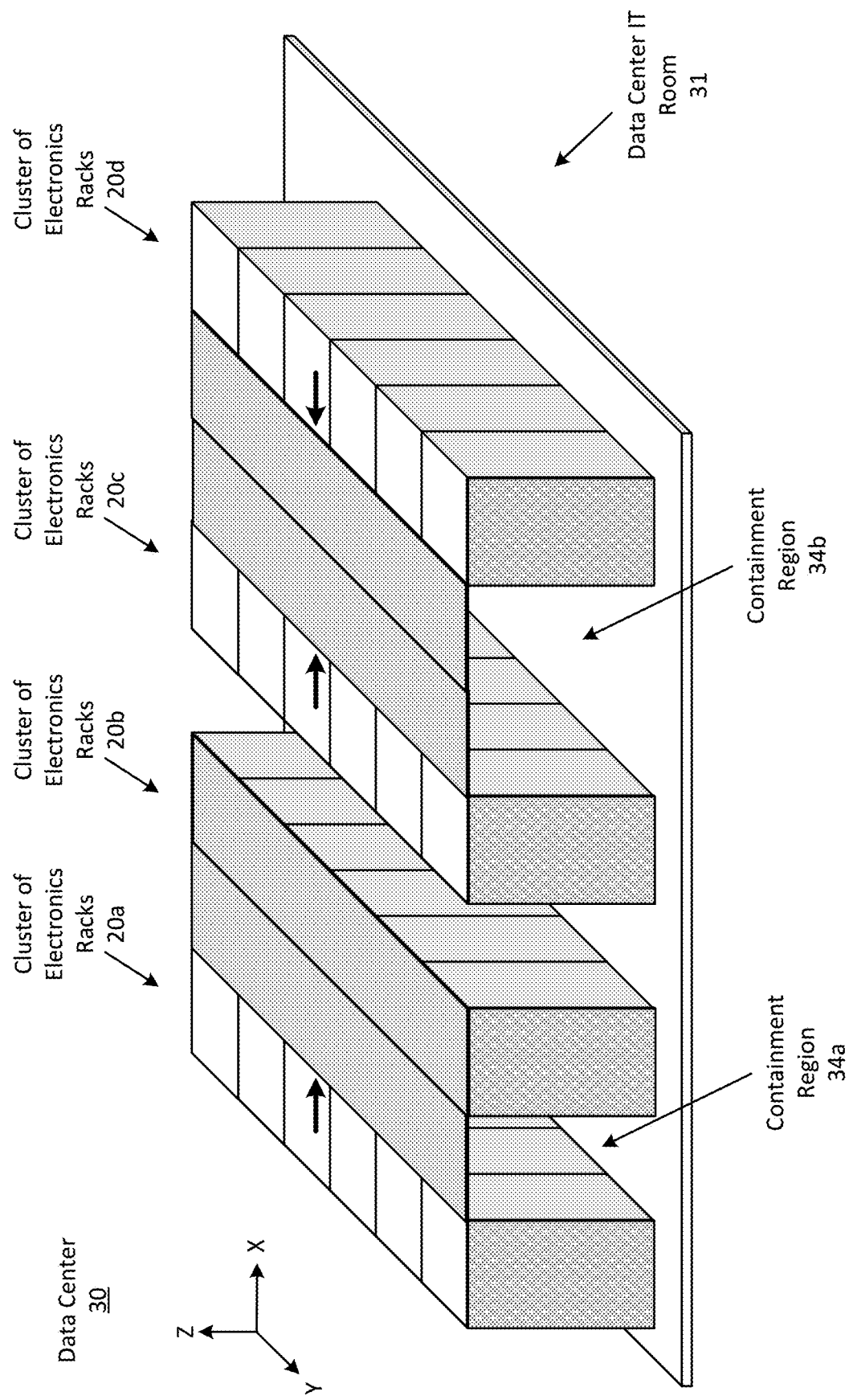
Figure 5C:
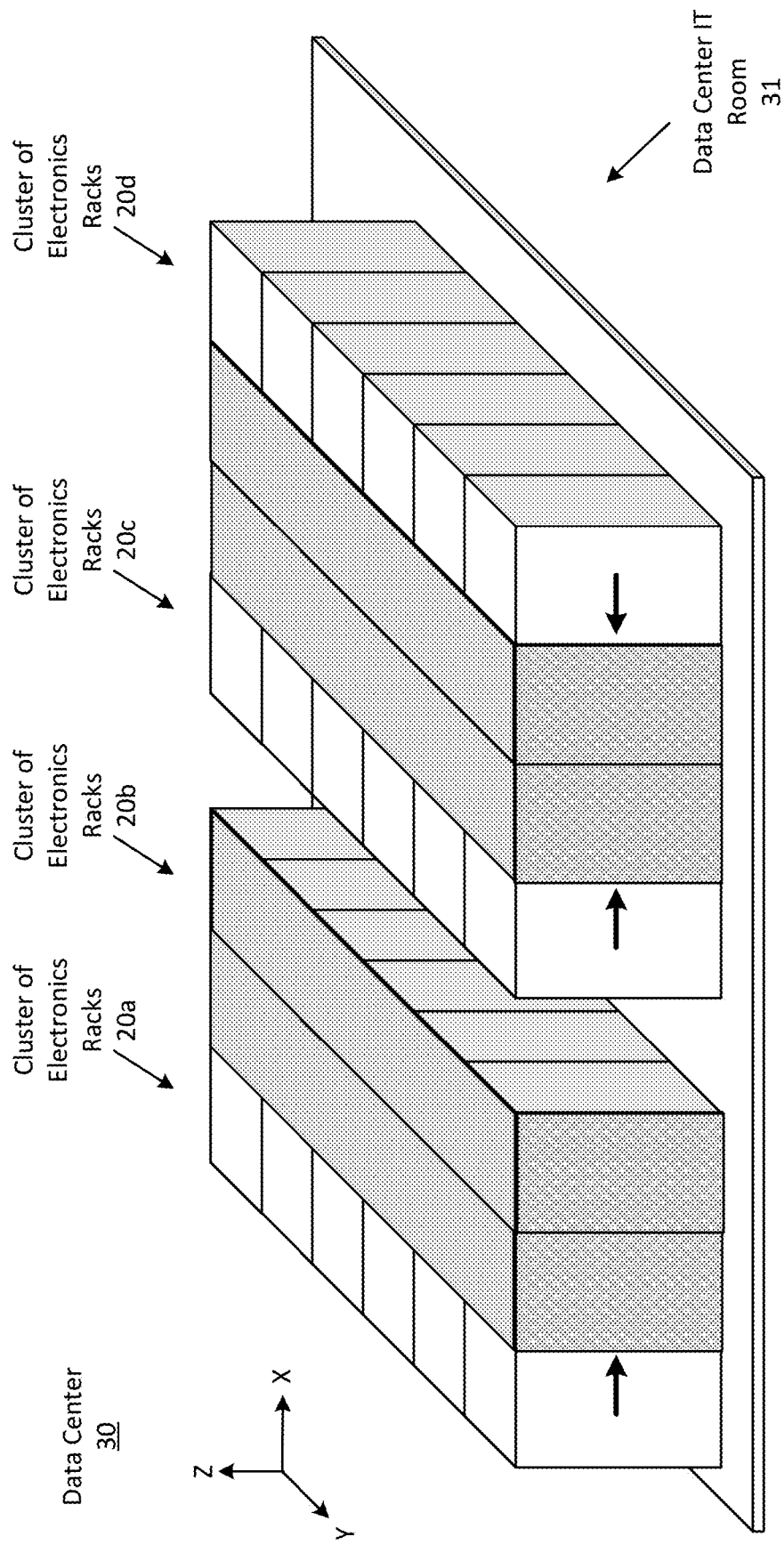

FIGS. 5a- 5c show perspective views of a data center 30 that includes several clusters of electronics racks 20a-20d with a containment system that is used to create containment regions about the clusters of racks according to one embodiment. Specifically, these figures are showing a data center IT room 31 that is a part of (e.g., contained within) a data center 30 (e.g., building) that includes several clusters of electronics racks 20-20d, where each of the clusters includes six electronics racks 2 arranged in a row. In one embodiment, the racks within the clusters may be aligned with each other and/or may be aligned with racks of other clusters. For instance, as shown, each of the clusters of racks are aligned with each other (e.g., along the Y-axis). For example, each electronics rack in each cluster is aligned (e.g., along at least the Y-axis) with each other corresponding rack from the remainder of clusters. Thus, the cluster of electronics racks create six columns of electronics racks that are arranged along the X-axis. In addition, each of the racks in each of the clusters are aligned with each other along the Y-axis and/or the Z-axis, as shown. In one embodiment, one or more clusters of electronics racks may be unaligned (e.g., along the Y-axis) with other clusters of racks.

Each adjacent pair of clusters of racks are separated by at least one aisle. For instance, clusters 20a and 20b are separated by aisle 33a, clusters 20b and 20c are separated by aisle 33b, and clusters 20c and 20d are separated by aisle 33c. In one embodiment, one or more clusters of electronics racks may adjoin one another (e.g., not being separated by an aisle). As shown, aisle 33a and 33b have a depth (e.g., a distance between clusters 20a and 20b) of $D_2$, whereas aisle 33c has a depth of $D_3$. In one embodiments, $D_3$ may be greater than $D_2$, such as being twice the depth of $D_2$). In another embodiment, all of the aisles may have the same depth (e.g., $D_2$).

The clusters of racks are positioned on an elevated (or raised) floor 32, which provides a network for distributing (circulating) cold air throughout the data center IT room 31. For instance, the elevated floor may be coupled (via one or more air ducts) to one or more air conditioning units, such as Computer Room Air Conditioning (CRAG)) units, (not shown) that push cold air into the room 31 through one or more openings (not shown) within the elevated floor. For example, the floor may comprise one or more panels, each panel including one or more perforations. In one embodiment, these perforated panels may be positioned throughout one or more of the aisles 33a-33c. In one embodiment, the data center IT room 31 may include one or more return ducts (not shown) that are coupled to the air conditioning unit, which may be configured to draw hot exhaust air (produced by one or more electronics racks) through the one or more return ducts. The air conditioning unit may be configured to cool the hot exhaust air to produce cold air that is then redistributed into the data center 30 (e.g., via the elevated floor).

In conventional data centers, electronics racks are air cooled through data center cold aisle containment (CAC) systems or hot aisle containment (HAC) systems. To achieve either system, a layout of aisles and rows of racks are preconfigured to provide proper aisle containment. For instance, with CAC systems, certain aisles are predefined and isolated from a remainder of the data center in order to supply cold air (e.g., distributed through the elevated floor 32) to adjacent rows of racks, where the cold air is isolated from a remainder of the data center IT room 31 that includes hot exhaust air that is produced by the racks when the cold air passes from the cold aisle, through the racks, and into the remainder of the data center. As a result, the arrangement of clusters deployed within these conventional data centers is dependent upon the center's air cooling layout, which is defined when the data center is built.

The present disclosure, however, provides containment systems with several structures coupled to the clusters (e.g., each cluster having an independent system), which may customize the air cooling containment layout within the data center IT room 31 to air cool racks through the use of CAC system deployment and/or HAC system deployment. As shown, each cluster 20a 20d includes (a containment system with) a top structure 43 (which may be similar or the same as top structure 3) that is disposed on top of the respective cluster, and a first side structure 44 (which may be similar or the same as first side structure 4) that is disposed on one side (e.g., right side) of an electronics rack that is arranged at an end of each row of racks (e.g., along the Y-axis). For instance, top structure 43a is disposed on top of the racks of cluster 20a and the first side structure 44a is coupled to the right side of the electronics rack that is disposed at the end of the row (in the positive Y-direction). In one embodiment, each cluster of racks may also include a second side structure (not shown), which may be disposed on an opposite side (e.g., a left side) of another electronics rack that is arranged at an opposite end of each row of racks. More about the second side structure is described in FIG. 6.

In one embodiment, one or more of the structures may have a similar depth as one or more of the aisles. For example, as shown, each of the structures has a depth of $D_1$, which may be equal to $D_2$. In another embodiment, the structures may have a depth that is greater or less than a depth of an aisle that is adjacent to the cluster of racks to which the structures are coupled. For instance, $D_1$ may be slightly greater than $D_2$ (e.g., above a threshold distance). This difference in depth may allow structures to extend from a cluster of racks and come into contact with an adjacent cluster of racks (and/or with structures coupled to the adjacent cluster). In addition, each of the structures may include similar dimensions, as describe herein. For example, the top structure may have a width (e.g., $W_2$) that extends along a total width of the row of racks in the top structure's cluster. In another embodiment, the width of the top structure may extend more outwardly, such as having a width of $W_3$ so as to overhang (slightly) over side structures that are coupled to ether end of an associated cluster, as described herein.

In one embodiment, the structures of at least some of the clusters may be aligned with one another. For example, the top structures 43a and 43b of clusters 20a and 20b, respectively, may be aligned with one another along one or more axes (e.g., along the Z and Y axes). The structures may be aligned such that when one or both of the structures are moved (e.g., towards each other) they (at least partially) come into contact with one another without having (or having a minimal amount of) space between two adjoining structures. More about moving the structures is described herein.

In this figure, the structures are in their stored positions. In particular, the first side structures 44a-44d and the top structures 43a-43d (and second side structures that are not shown) are not being used to create containment regions about their respective clusters.

FIGS. 5b and 5c illustrate the creation of several containment regions by the structures of at least some of the clusters of racks 20a-20d. In particular, FIG. 5b shows that several top structures 43 of (at least some of the) clusters have moved towards adjacent clusters along the X-axis, creating containment regions. As shown, the top structure 43a of the 20a has moved towards cluster 20b, being disposed over (or above) aisle 33a to create a containment region 34a, which is surrounded by this top structure and the two clusters 20a and 20b. In addition, both top structures 43c and 43d of clusters 20c and 20d, respectively, have moved towards each other to create containment region 34b. Specifically, the top structure 43c has moved towards cluster 20d, while the top structure 43d has moved towards cluster 20c. As a result, the containment region 34b is created by these top structures and their associated clusters. In one embodiment, the moved top structures may come into contact with (or abut) adjacent top structures. For example, the top structure 43a may come into contact with structure 43b, and structures 43c and 43d may come into contact with each other, in another embodiment, the moved structures may at least partially come into contact with the adjacent row of racks towards which the clusters have moved. For instance, the top structure 20a may come into contact with (e.g., the top 96) of cluster 20b. Coming into contact with other structures (and/or racks) may prevent or reduce an amount of air that leaks out of (or into) the containment region created by the structures. As illustrated, the created containment regions are partially exposed to (via openings along the aisles of) the data center IT room 31, since (at least) the first side structures 44 of the clusters have remained in their positions stored positions. Thus, the containment system is only in a partially extended position.

FIG. 5c shows that some of the first side structures 44 have moved towards adjacent clusters along the X-axis, thereby closing off the openings shown in FIG. 5b. In particular, this figure is showing that at least some of the structures of the containment system are in their extended positions to create (e.g., fully) containment regions. As shown, the first side structure 44a has moved towards (and is coming into contact with) the structure 44b, closing off the aisle 33a, and the first side structures 44c and 44d have moved towards (and are in contact with) each other to close off aisle 33c. Thus, the containment regions 34a and 34b may be closed (or at least partially closed) off (segregated or partitioned) from a remainder of the data center IT room 32.

Figure 6:
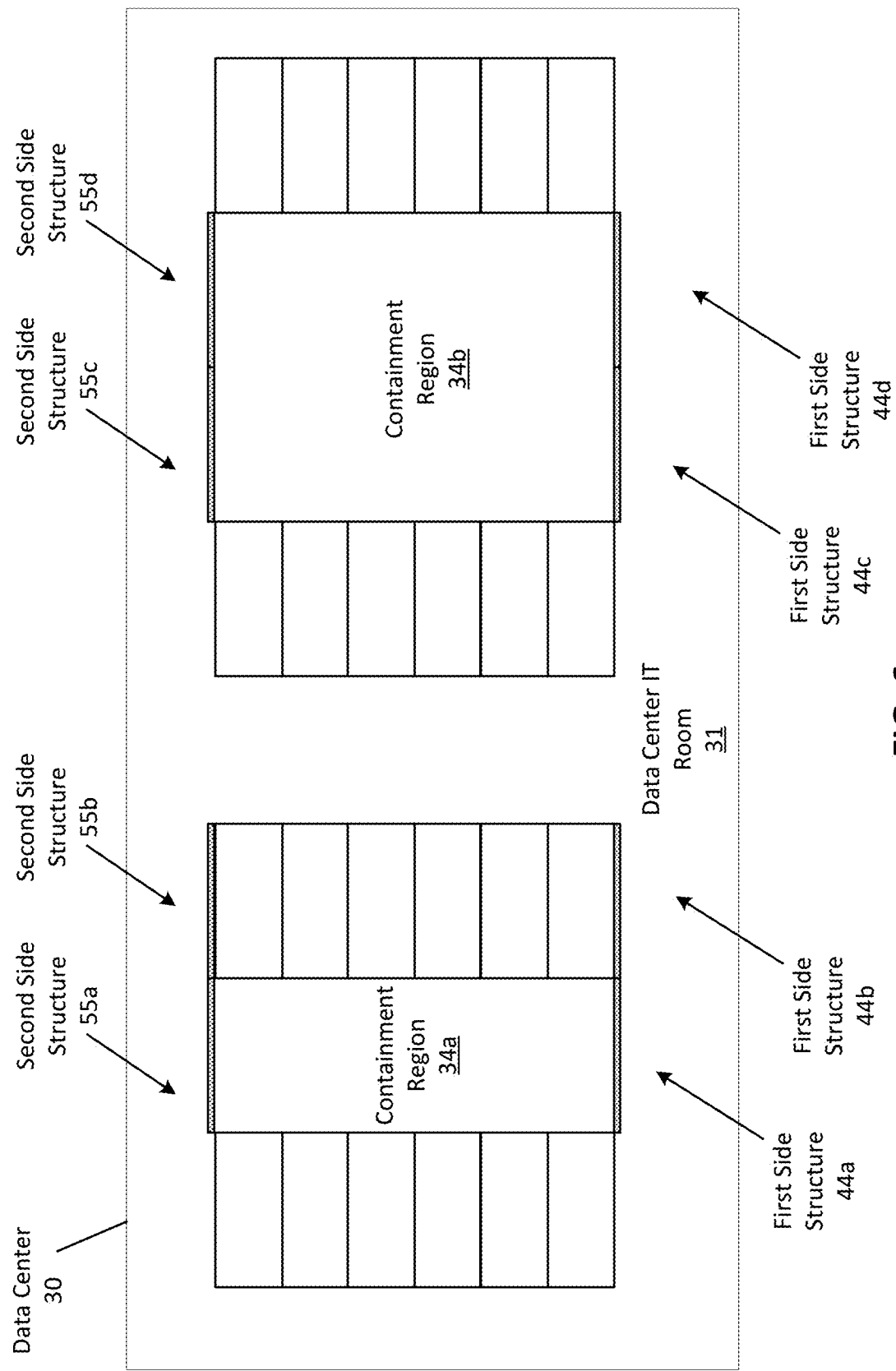
FIG. 6 is a cross-sectional top-down view of the data center that shows containment regions between clusters of electronics racks according one embodiment.

FIG. 6 is a cross-sectional top-down view of the data center 30 that shows containment regions 34a and 34b between the clusters 20a-20d according one embodiment. Specifically, this figure is showing a cross-sectional view of the data center 30 shown in FIG. 5c. This figure shows that (the containment system of) each cluster also includes second side structures 55 (which may be similar or the same as second side structure 5), where at least some of these second side structures have moved in a same direction as the first side structures 44, thereby creating the containment regions. In particular, the second side structure 55a of cluster 20a has moved towards cluster 20b (and is in contact with the structure 55b), and second side structures 55c and 55d of clusters 20c and 20d, respectively have moved towards (and are in contact with) each other. Thus the containment region 34a is created and surrounded by the first side structure 44a, the second side structure 55a, the top structure 43a and the clusters (e.g., front ends or back ends of) 20a and 20b, and the containment region 34b is created and is surrounded by clusters 20c and 20d and all of their respective structures.

In one embodiment, the containment regions created by the structures may be cold aisles, hot aisles, or a combination of both. For example, the containment region 34a may be a cold aisle in which cold air is pushed into the region (e.g., being distributed from the portion of elevated floor that makes up the aisle 33a), and hot air produced by the clusters 20a and 20b is then expelled into the room 31. As another example, the containment region 34a may be a hot aisle in which cool air from the IT room 31 is being drawn into the containment region, and hot exhaust air from the cluster of racks entering the region is then pushed (e.g., via one or more ducts coupled to the region) to a data center air conditioning unit (e.g., CRAC unit).

As illustrated, the (e.g., area of the) containment region 34b is greater than the containment region 34a. This is due to $D_3$ of aisle 33c being greater than e.g., twice the length of) $D_2$ of aisle 33a. In one embodiment, the containment region 34b may provide more airflow (e.g., when the region is a cold aisle) than the containment region 34a. For example, when both regions are cold aisles, the aisle 33c may allow more cold air into the region (e.g., due to having more openings (or perforated panels) in the elevated floor 32) than the aisle 33a (e.g., cold air flowing into containment region 34b may have an airflow rate that is greater than an airflow rate of cold air flowing into containment region 34a), This increased airflow may allow clusters 20c and 20d to house electronics (e.g., high-power density electronics) that require more cooling than other electronics. Specifically, these high-power density electronics may produce more heat than standard electronics. As a result, more airflow may be required in order to provide efficient and effective air cooling. Thus, the present disclosure provides a containment system that is able to accommodate different airflow management requirements and different power densities of electronics housed within the clusters of the data center.

As described thus far, the containment region 34a may be created by the first sides structure 44a, the top structure 43a and the second sides structure 55a moving towards (and coming into contact with) cluster 20b. In another embodiment, the structures of cluster 20b may be used to create the region. In which case, structures 43b, 44b, and 55b may be extended towards cluster 20a. In another embodiment, the cooling containment layout may be different (e.g., a containment region created about aisle 33b).

Figure 7:
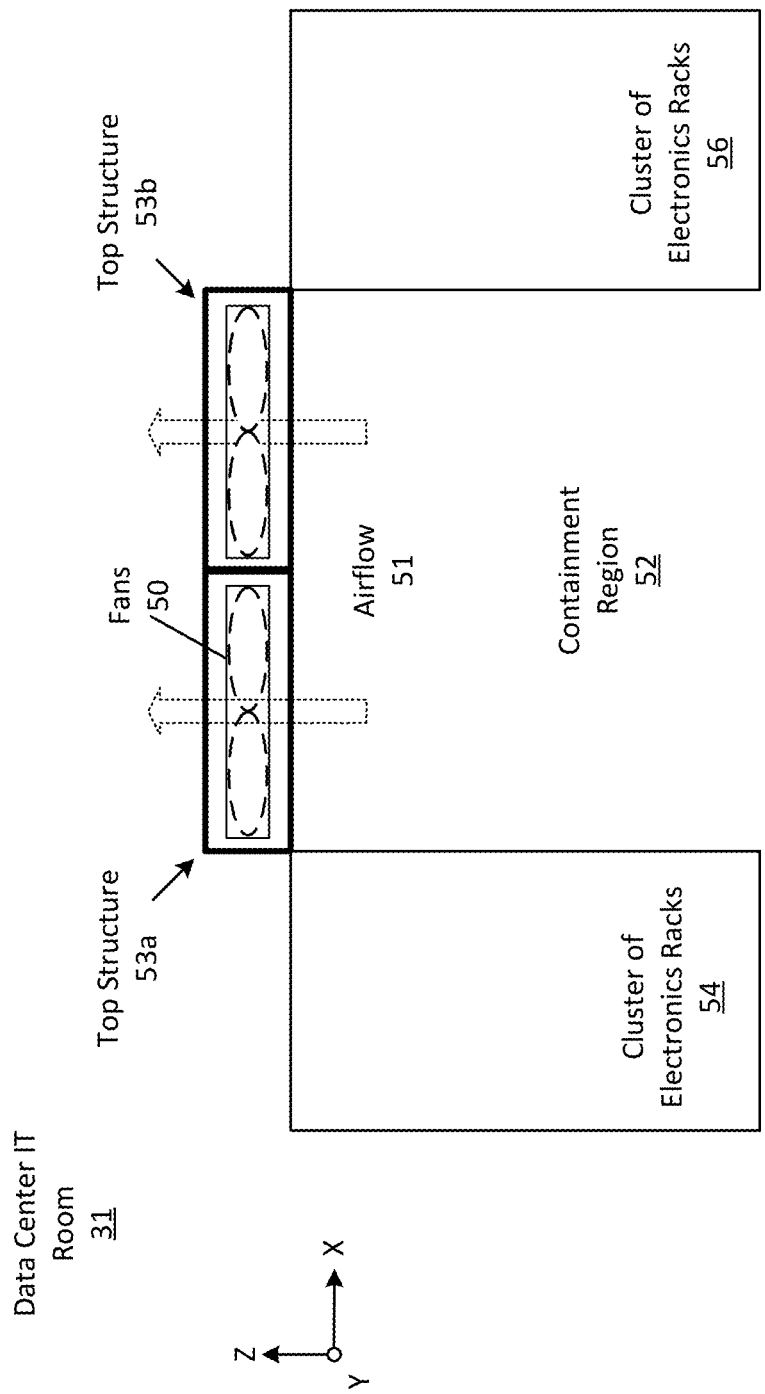
FIG. 7 is a cross-sectional aisle end view of two clusters of electronics racks and their respective top structures that have fans according to one embodiment.

FIG. 7 is a cross-sectional aisle-end view of two clusters of electronics racks and their respective top structures that have fans according to one embodiment. Specifically, this figure is showing a cross-sectional view of two clusters 54 and 56 with the containment system that is creating a containment region between the two clusters. In particular, a top structure 53a of cluster 54 has extended towards duster 56 and a top structure 53b of cluster 56 has extend towards cluster 54, thereby creating a containment region 52 that is (at least) surrounded by both top structures and their respective clusters of electronics racks. In one embodiment, these clusters and structures may be similar (or the same) as the clusters and structures illustrated in FIGS. 5a-5c.

Both top structures 53a and 53b each include two fans 50 (that are side-by-side and) that are arranged to push air into or out of the containment region 52. In one embodiment, the top structures may have one or more fans. In another embodiment, the top structures may each have a different number of fans, such as top structure 53a having one fan, while top structure 53b has two fans. The fans 50 are illustrated as actively drawing air (e.g., by spinning, which is shown by the fans being illustrated as dashed ovals) from the containment region 52, thereby producing airflow 51 in which air is flowing from the region 52, through (e.g., one or more openings at a bottom of) the top structures, and is being expelled out (e.g., one or more openings at a top) of the top structures (e.g., into the data center IT room 31). In one embodiment, the airflow 51 produced by the fans may be pulling air through the clusters 54 and 56. For instance, the airflow may cause (e.g., cold) air from outside the containment region 52 to be drawn through (e. openings in the) cluster of racks, into the region 52, and out through the top structures.

In one embodiment, the clusters 54 and 56, which may be similar to clusters 20c and 20d of FIG. 5a, in which a containment region 52 is created between the clusters. Also shown are top structures that are disposed on top of (and coupled to) the two clusters, and are both in their extended positions. In particular, top structure 53a is movably coupled to cluster 54 and top structure 53b is movably coupled to cluster 56, where both clusters have been moved towards (and are in contact with) each other.

Figure 8:
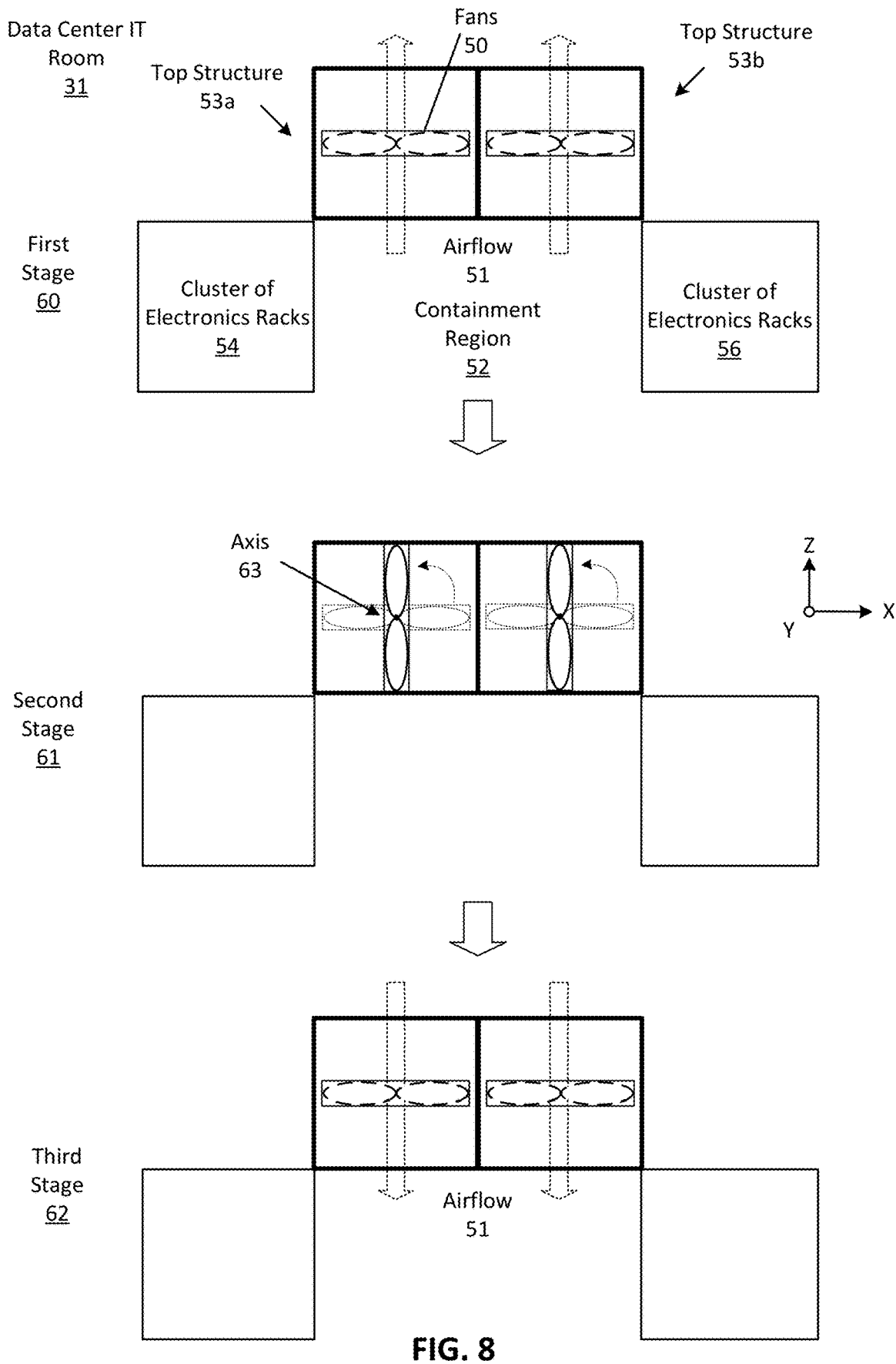
FIG. 8 shows several stages of the cross-sectional view that shows fans of top structures being rotated according to one embodiment.

FIG. 8 shows several stages 60-62 of the cross-sectional view that shows fans of top structures being rotated according to one embodiment. Each of the stages shows the cross-sectional view of clusters 54 and 56 and their respective top structures 53a and 53b of FIG. 7, each of which include two side-by-side fans 50. In one embodiment, the fans are arranged to rotate about an axis to change a direction towards which the fan pushes air.

The first stage 60 shows the fans 50 of both top structures 53a and 53b producing an airflow 51 in which air is being drawn out of the containment region 52 and is being expelled out a top (e.g., one or more openings) of the top structures. The second stage 61 shows that each pair of fans is being rotated (e.g., counterclockwise). Specifically, the fans of both top structures are arranged to rotate about axis 63, which is a center axis with respect to both pairs of fans. in particular, the axis 63 is the Y-axis, while is perpendicular to the X-axis along which the structures are arranged to move. In another embodiment, the fans may rotate about any axis. To rotate the fans, the fans have been shut off, which is illustrated as the fans being ovals with solid. borders. In another embodiment, the fans may be rotated while they continue to spin.

The third stage 62 shows that the fans 50 of both top structures 53a and 53b have rotated 180°, and are now pushing air into the containment region 52. In particular, the direction of the airflow 51 has switched from pointing out of the region to now being pointed into the region 52. In one embodiment, the air that is being drawn into the region may be from inside the data center IT room 31.

As described herein, the fans 52 may be configured to pull air out of the containment region or push air into the containment region. In one embodiment, the fans may pull/push air based on whether the containment region is being used as a cold aisle or a hot aisle. For example, when the containment region is a. hot aisle, the fans may be pulling air out of the containment region 52. In particular, the airflow 51 may draw air from outside in the data center IT room and through the cluster of electronics racks 54 and 56. This drawn air may be cold air within the data center IT room 31 (e.g., that is being provided by a CRAC unit of the data center). Conversely, when the containment region 52 is a cold aisle, the fans may be pushing air into the containment region 52. For instance, the top structures may be coupled to one or more CRAC units (e.g., via one or more ducts), and may draw cold air being provided by the CRAC units into the containment region. The cold air in this case would be pushed through the cluster of electronics racks, which are transferring heat into the cold air, thereby producing hot air. This hot air is expelled into the data center IT room 31.

In another embodiment, the fans may be adapted in order to accommodate different data center airflow supply and return designs. For instance, a fan speed of one or more of the fans may be adjusted based on a current airflow rate within the data center (e.g., the fan speed may be increased in order to increase the airflow rate throughout the data center IT room.

Figure 9:
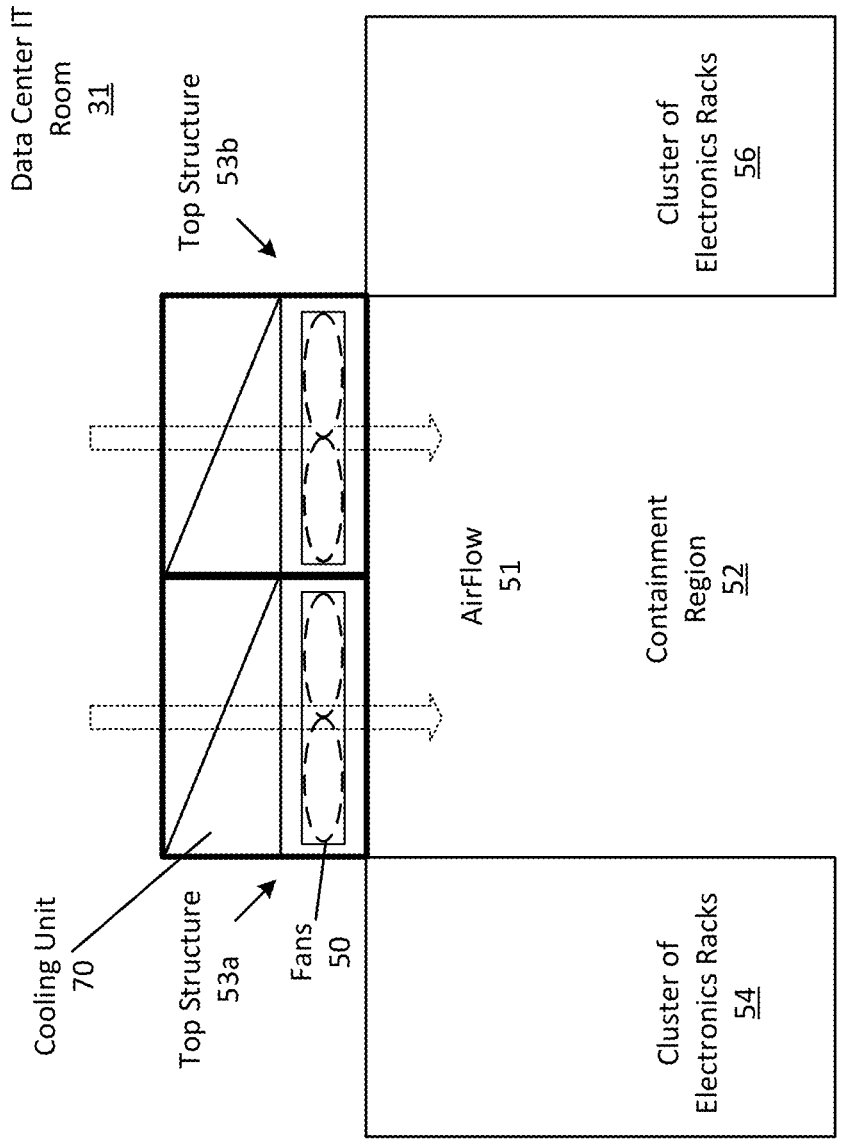
FIG. 9 shows another cross-sectional view of two clusters of electronics racks and their respective top structures according to one embodiment.

FIG. 9 shows another cross-sectional view of two clusters of electronics racks 54 and 56 and their respective top structures 53*a* and 53*b* according to one embodiment. Specifically, this figure shows that each top structure includes a cooling unit 70 that is arranged to produce cooled air. In one embodiment, the cooling unit may be any type of air cooling unit, such as being an Indirect Evaporative Cooling (IDEC or IEC) unit, an Air Handler Unit (AHU), which is configured to provide cooling air. In this example, the containment region 52 may be a cold aisle. For example, the cooling unit may be producing cooled air from ambient air that is pulled by the fans from outside the containment region (e.g., air within the data center IT room 31) through the cooling unit 70. This cooled air may then be pushed into the containment region by the fans 50 and through the clusters 54 and 56 in order to cool components contained therein. In one embodiment, the cooling units may allow the cold aisle created by the structures to receive cold air when the containment region is not receiving cold air from a data center air conditioning unit (e.g., the aisle making up the region is not arranged to receive cold air from a CRAC unit). As a result, the containment system may be used to create a cold aisle with the containment region 52 and one or more cooling units 70 (e.g., without having to draw cold air from a data center air condition source). In another embodiment, the cooling unit 70 may be configured to cool hot air from the containment region (e.g., when the fans are directing the airflow 51 out of the region), in order to create a hot aisle.

As described thus far, each of the top structures 53*a* and 53*b* include two fans that are arranged to pull/push air. In one embodiment, the fans may be operated at the same time. In another embodiment, one pair of fans may be redundant, such that during operation one pair of fans may be used while the other pair may be only used under certain conditions (e.g., the other pair malfunctioning).

Figure 10:
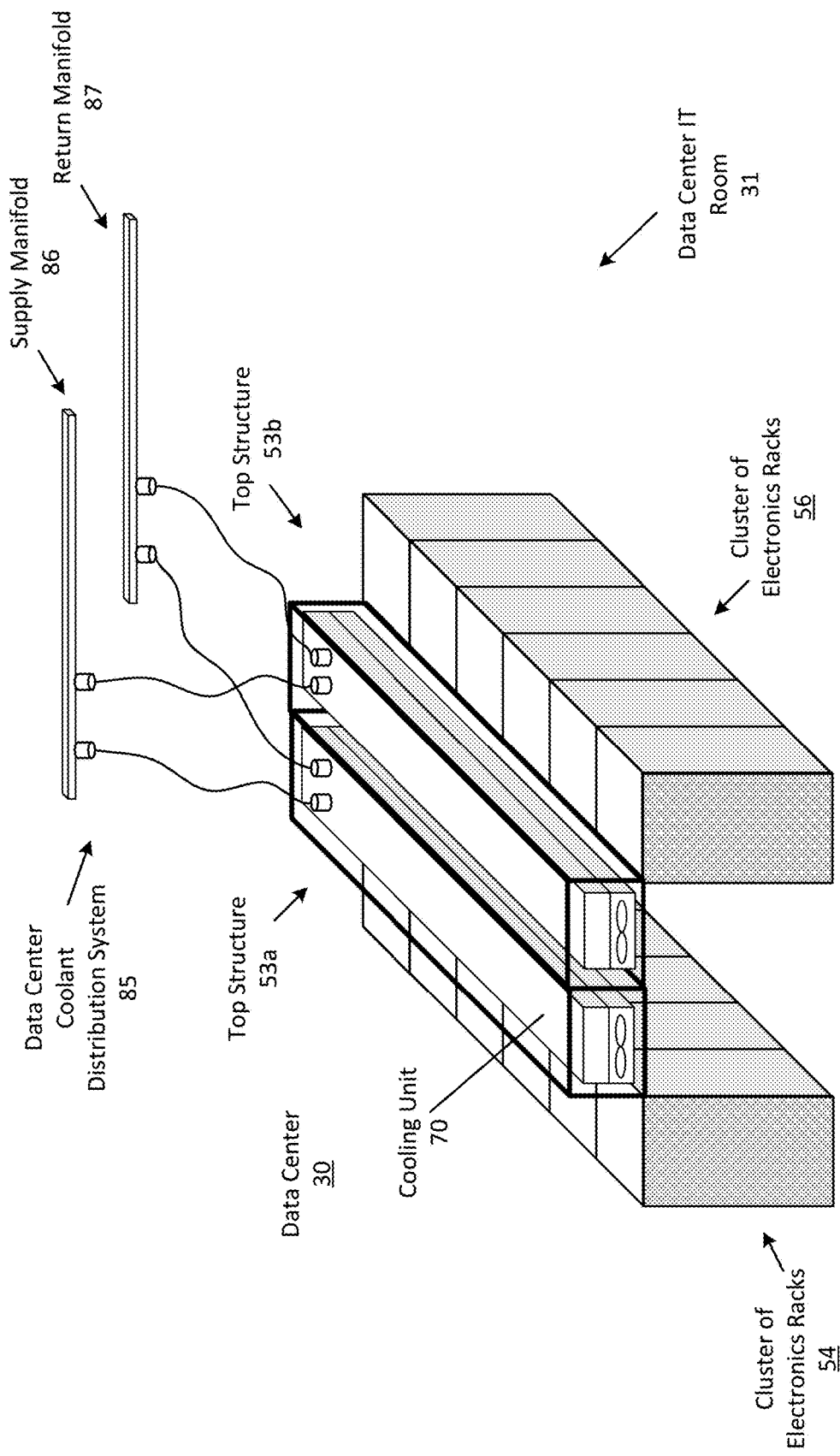
FIG. 10 shows a perspective view of a data center that includes clusters of electronics racks and a data center coolant distribution system according to one embodiment.

FIG. 10 shows a perspective view of a data center that includes clusters of electronics racks and a data center coolant distribution system according to one embodiment. In particular, this figure shows that the (e.g., cooling units 70 of the) top structures 53*a* and 53*b* of clusters 54 and 56, respectively, are coupled to a data center coolant distribution system 85. In one embodiment, the system 85 may be any data center cooling liquid system, which may be integrated into the data center 30. In this example, the cooling units 70 of the top structures may be air-to-liquid heat exchangers that are (fluidly) coupled to a supply manifold 86 and a return manifold 86 of the data center system 85, thereby creating a primary heat exchanging loop. For instance, as the fans draw hot air from the data center IT room into the cooling units of the top structures, heat in the air is transferred into coolant of the cooling units that is received from the supply manifold. This transfer of heat produces warmed coolant, which the cooling units then provide to the return manifold. In one embodiment, the system 85 may include a heat exchanging source that is arranged to receive the warmed coolant and circulate cooled coolant through the supply manifold.

As described herein, the containment system 1 may include various components (e.g., structures) for creating one or more containment regions for a cluster of one or more electronics racks. The system may also include components, such as fans, that are used to control airflow through the created containment regions. In one embodiment, some of the structures may include one or more components, such as top structures 53 including one or more fans. In another embodiment, other structures described herein may include one or more of those same components. For instance, top structure 3 may include one or more fans. In yet another embodiment, one or more side structures may include components such as fans.

In one embodiment, the system may include one or more sensors that are arranged to control the fan speed of the one or more fans. For example, the sensors may be temperature sensors, which are communicatively coupled with (e.g., control electronics, such as a. processor, memory, etc.) of the fans, and are configured to control the speed of the fans based on the detected temperature. In one embodiment, the sensors may be arranged to detect the temperature of one or more electronics components of one or more racks, and are configured to control the speed based on temperatures of the components. In another embodiment, the sensors may be arranged to detect the temperature within the containment region.

As shown in this figure, the top structures are coupled to the data center coolant distribution system. In one embodiment, the structures may be coupled via connectors, which are arranged to removeably couple the structures to the system 85. In some embodiments, these connectors may be dripless quick disconnect connectors, thereby allowing structures to be added or removed to the data enter coolant distribution system.

Figure 11:
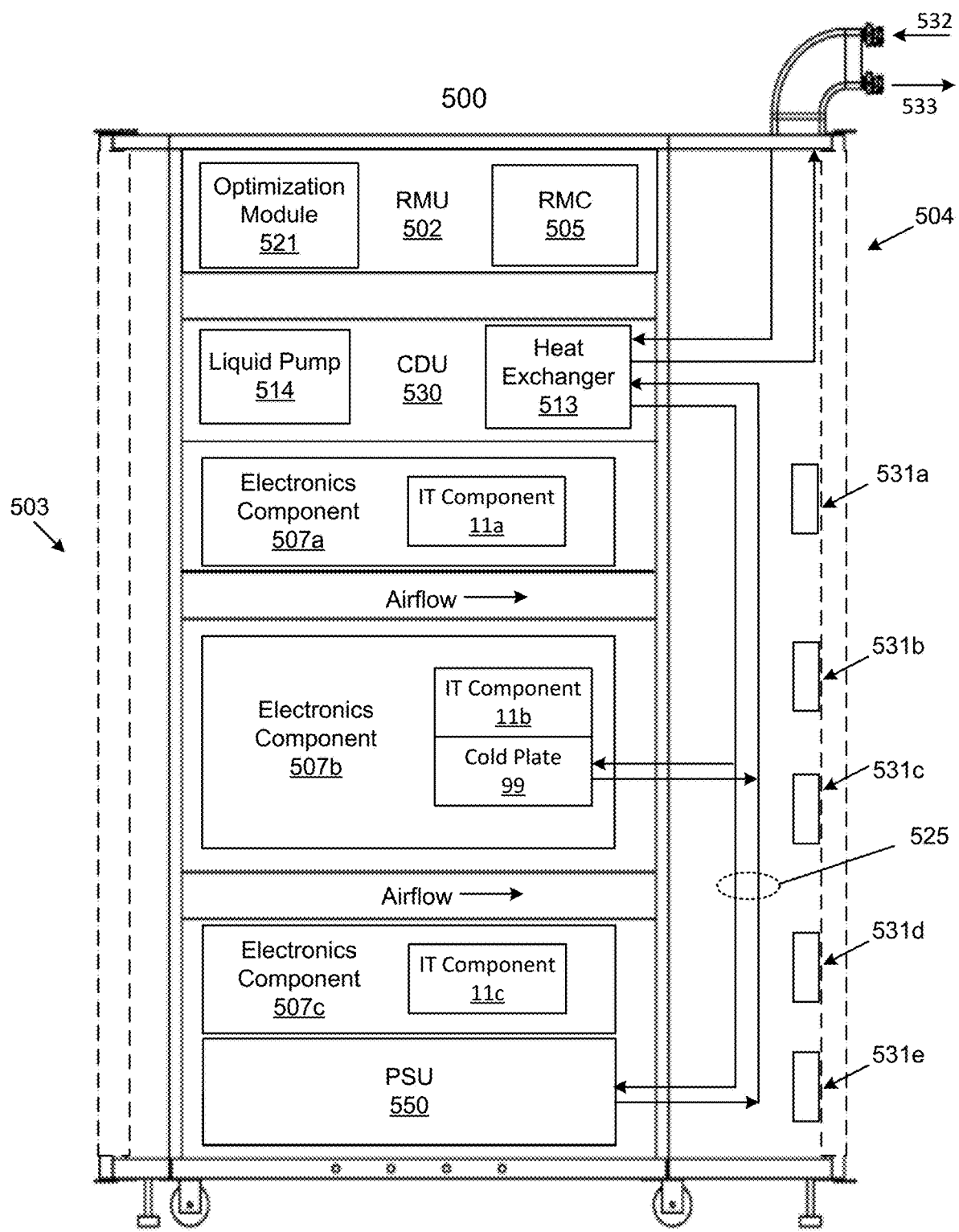
FIG. 11 is an example of an electronics rack according to one embodiment.

FIG. 11 is an example of an electronics rack 500 according to one embodiment. In one embodiment, the electronics rack 500 may include one or more of the same components as rack 2, as described herein. Electronics rack 500 may include one or more server slots (e.g., that are arranged in a stack within a housing of the rack) to contain one or more electronics boards, such as electronics components (or servers), respectively. In one embodiment, each server includes one or more IT components (e.g., processors, memory, storage devices, network interfaces), which may be for providing data processing services, as described herein. According to one embodiment, electronics rack 500 includes, but is not limited to, CDU 530, rack management unit (RMU) 502 (optional), a power supply unit (PSU) 550, and one or more electronics components (or electronics boards) 507*a*-507*c*, which may be any type of IT equipment, such as server blades (e.g., that are mounted within the rack). As shown, each component includes a respective IT component 11. In one embodiment, each electronics component may include one or more IT components. The component 507 can be inserted into an array of server slots respectively from front end 503 or back end 504 of electronics rack 500. In one embodiment, the electronics components may be arranged in a stack (e.g., where component 507a is positioned above 507b), as shown herein.

In one embodiment, the electronics rack 500 may be a part of a cluster of racks (e.g., cluster 20 of FIG. 3). In which case, the rack 500 may be arranged to have (or be a part of) the containment system 1. For example, one or more structures of the system may be coupled to one or more sides of the rack 500.

Note that although there are only four electronics components 507a-507c shown here, more or fewer electronics components may be maintained within electronics rack 500. Also note that the particular positions of CDU 530, RMU 502, PSU 550, and components 507 are shown for the purpose of illustration only; other arrangements or configurations of these components. may also be implemented. Note that electronics rack 500 can be either open to the environment or partially contained by a rack container, as long as the cooling fans can generate airflows from the front end to the back end (or generate airflows from the back end to the front end).

In addition, a fan module can be associated with each of the electronics component 507, and the PSU module. In this embodiment, fan modules 531a-531e , collectively referred to as fan modules 531, and are associated with the electronics components 507a -507c and the PSU, respectively. Each of the fan modules 531 includes one or more cooling fans. Fan modules 531 may be mounted on the backend of component 507 to generate airflows flowing from front end 503, traveling through the rack 500, and existing at back end 504 of electronics rack 500. For example, referring to FIG. 5a, when the rack is a part of cluster 20b and its back end is adjacent to aisle 33b, the fans may generate airflow in which air is drawn from aisle 33a (or containment region 34a) and hot exhaust air produced by heat generated by the electronics of the rack being transferred to the drawn cold air is expelled out into aisle 33b. In another embodiment, one or more of the fan modules may be positioned on the front end 503 of the rack 500. Such front end fans may be configured to push air into the mounted equipment.

In one embodiment, CDU 530 mainly includes heat exchanger 513, liquid pump 514, and a pump controller (not shown), and some other components such as a liquid reservoir, a power supply, monitoring sensors and so on. Heat exchanger 513 may be a liquid-to-liquid heat exchanger. Heat exchanger 513 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on back end 504 of electronic rack 500, The liquid supply/return lines 532-533 are coupled to a set of room manifolds, which are coupled to an external heat removal system, or extremal cooling loop. In addition, heat exchanger 513 further includes a second loop with two ports having a second pair of liquid connectors coupled to liquid manifold 525 to form a secondary loop, which may include a supply manifold to supply cooling liquid to one or more electronics components and a return manifold to return warmer liquid back to CDU 530. For example, the electronics component 507b may be arranged to be liquid cooled using liquid that is circulating through the manifold 525. In particular, a cold plate 99 of the component is coupled to an IT component 11b, and is arranged to provide liquid cooling (e.g., by transferring heat generated by the IT component 11b into liquid circulating through the plate, Note that CDUs 530 can be any kind of CDUs commercially available or customized ones. Thus, the details of CDUs 530 will not be described herein. In another aspect, at least some of the electronics components may be liquid cooled, while one or more other components may be air cooled (e.g., using air drawn into or out of the rack via the one or more fans)

Electronics rack 500 further includes optional RMU 502 configured to provide and manage power supplied to servers 507, fan modules 531, and CDU 530. Optimization module 521 and RMC 505 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronics rack 500.

In one embodiment, the (e.g., PSU 550 of the) electronics rack 500 may draw power from the AC mains to power electronics mounted therein. In another embodiment, the rack may draw power from one or more renewable power sources, such as a photovoltaic (PV) power system. In this case, the electronics rack may draw power from one or more renewable energy sources (e.g., PV systems), and supply the electronics components 507 and/or other components of the electronics rack cooling capabilities and/or perform leak detection operations, as described herein. In one embodiment, the PSU may be electrically coupled to any type of power source.

In one embodiment, RMU 502 includes optimization module 521 and rack management controller (RMC) 505. RMC 505 may include a monitor to monitor operating status of various components within electronics rack 500, such as, for example, the component 507, CDU 530, and fan modules 531. Specifically, the monitor receives operating data from various sensors representing the operating environments of electronics rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 514, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 514, such that the total power consumption of liquid pump 514 and fan modules 531 reaches minimum, while the operating data associated with liquid pump 514 and cooling fans of fan modules 531 are within their respective designed specifications. Once the optimal pump speed and optimal fan speeds have been determined, RMC 505 configures liquid pump 514 and cooling fans of fan modules 531 based on the optimal pump speed and fan speeds. 100931 As an example, based on the optimal pump speed, RMC 505 communicates with a pump controller of CDU 530 to control the speed of liquid pump 514, which in turn controls a liquid flow rate of cooling liquid supplied to the rack liquid manifold to be distributed to at least some of the component 507. Therefore, the operating condition and the corresponding cooling device performance are adjusted. Similarly, based on the optimal fan speeds, RMC 505 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the component 507 may utilize different cooling methods. For instance, one server may utilize air cooling while another server may utilize liquid cooling. Alternatively, one IT component of a server may utilize air cooling while another IT component of the same server may utilize liquid cooling (e.g., via one or more cold plates that are fluidly coupled to the rack liquid manifold, as described herein).

As previously explained, an embodiment of the disclosure may be (or include) a non-transitory machine-readable medium (such as microelectronic memory) having stored thereon instructions, which program one or more data processing components (generically referred to here as a "processor") to perform containment operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a. restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A containment system for an electronics rack, the containment system comprising:
   a top structure that is movably coupled on top of the electronics rack;
   a first side structure that is movably coupled to a first side of the electronics rack;
   a second side structure that is movably coupled to a second side of the electronics rack that is opposite to the first side,
   wherein each of the structures is arranged to move by sliding linearly along a set of rails along an axis and at least partially beyond either a front end or a back end of the electronics rack creating a containment region that is at least partially surrounded by the top structure, the first side structure, and the second side structure, wherein the top structure comprises at least one fan which is arranged to rotate 180° From a first orientation to a second orientation for different air flow directions; and wherein the top structure further comprises a cooling unit to be coupled to a supply manifold and a return manifold of a data center coolant distribution system; and
   for each structure of the top structure, the first side structure and the second side structure, a structure including:
   a panel; and
   a sealing layer disposed between the panel and an outer surface of a side of the electronics rack, wherein the panel and the sealing layer are removeably coupled to one another, wherein the sealing layer is removeably coupled to the outer surface of the side of the electronics rack via a rail of the set of rails, wherein a containment region created by the containment system is sealed such that an internal pressure of the containment region remains below a predefined threshold, and wherein the sealing layer has a thickness that is substantially equal to a thickness of the rail.

2. The containment system of claim 1 further comprising:
   a first set of rails that are coupled to the top of the electronics rack and to the top structure;
   a second set of rails that are coupled to the first side of the electronics rack and to the first side structure; and
   a third set of rails that are coupled to the second side of the electronics rack and to the second side structure,
   wherein each of the structures is arranged to move by sliding linearly along its respective set of rails.

3. The containment system of claim 1, wherein the panel of the top structure extends at least along a width of the electronics rack, wherein the panel of each of the first and second side structures extends along a height of the electronics rack.

4. The containment system of claim 1, wherein the top structure comprises the at least one fan that is arranged to push air into or out of the containment region.

5. The containment system of claim 4, wherein the axis is a first axis, wherein the at least one fan is arranged to rotate about a second axis that is perpendicular to the first axis to change a direction towards which the at least one fan pushes air.

6. The containment system of claim 4, wherein the top structure further comprises the cooling unit that is arranged to produce cooled air from ambient air that is pulled from outside of the containment region by the at least one fan, wherein the cooled air is pushed into the containment region by the at least one fan.

7. A cluster of electronics racks that are arranged in a row, the cluster of electronics racks comprising:
   a top structure that is disposed on top of electronics racks in the cluster of electronics racks and is movably coupled on at least one of the electronics racks;

a first side structure that is movably coupled to a side of a first electronics rack that is positioned at one end of the row; and a second side structure that is movably coupled to a side of a second electronics rack that is positioned at another end of the row that is opposite to the one end, wherein each of the structures is arranged to move by sliding linearly along a set of rails along an axis and at least partially beyond either a front end or a back end of the cluster of electronics racks creating a containment region that is at least partially surrounded by the top structure, the first side structure, and the second side structure, wherein the top structure comprises at least one fan which is arranged to rotate 180° from a first orientation to a second orientation for different air flow directions; and wherein the top structure further comprises a cooling unit to be coupled to a supply manifold and a return manifold of a data center coolant distribution system; and for each structure of the top structure, the first side structure and the second side structure, a structure including:
a panel; and
a sealing layer disposed between the panel and an outer surface of a side of the electronics rack, wherein the panel and the sealing layer are removeably coupled to one another, wherein the sealing layer is removeably coupled to the outer surface of the side of the electronics rack via a rail of the set of rails, wherein a containment region created by the containment system is sealed such that an internal pressure of the containment region remains below a predefined threshold, and wherein the sealing layer has a thickness that is substantially equal to a thickness of the rail.

8. The cluster of electronics racks of claim 7 further comprising:
a first set of rails that are coupled to the top of the at least one of the electronics racks and to the top structure;
a second set of rails that are coupled to the side of the first electronics rack and to the first side structure; and
a third set of rails that are coupled to the side of the second electronics rack and to the second side structure,
wherein each of the structures is arranged to move by sliding linearly along its respective set of rails.

9. The cluster of electronics racks of claim 7, wherein the panel of the top structure extends at least along a width of the row, wherein the panel of each of the first and second side structures extends along a height of its respective electronics rack to which it is movably coupled.

10. The cluster of electronics racks of claim 7, wherein the top structure comprises at least one fan that is arranged to push air into or out of the containment region.

11. The cluster of electronics racks of claim 10, wherein the axis is a first axis, wherein the at least one fan is arranged to rotate about a second axis that is perpendicular to the first axis to change a direction towards which the at least one fan pushes air.

12. The cluster of electronics racks of claim 10, wherein the top structure further comprises the cooling unit that is arranged to produce cooled air from ambient air that is pulled from outside the containment region by the at least one fan, wherein the cooled air is pushed into the containment region by the at least one fan.

13. A data center comprising:
a data center information technology (IT) room;
a cluster of electronics racks that are disposed within the data center IT room and are arranged in a row; and
a containment system that includes:
a top structure that is disposed on top of the cluster of electronics racks and is movably coupled on at least one of the electronics racks,
a first side structure that is movably coupled to a side of a first electronics rack that is positioned at one end of the row;
a second side structure that is movably coupled to a side of a second electronics rack that is positioned at another end of the row that is opposite to the one end,
wherein each of the structures is arranged to move by sliding linearly along a set of rails along an axis and at least partially beyond either a front end or a back end of the cluster of electronics racks creating a containment region that is at least partially surrounded by the top structure, the first side structure, and the second side structure, wherein the top structure comprises at least one fan which is arranged to rotate 180° from a first orientation to a second orientation for different air flow directions; and wherein the top structure further comprises a cooling unit to be coupled to a supply manifold and a return manifold of a data center coolant distribution system; and for each structure of the top structure, the first side structure and the second side structure, a structure including:
a panel; and
a sealing layer disposed between the panel and an outer surface of a side of the electronics rack, wherein the panel and the sealing layer are removeably coupled to one another, wherein the sealing layer is removeably coupled to the outer surface of the side of the electronics rack via a rail of the set of rails, wherein a containment region created by the containment system is sealed such that an internal pressure of the containment region remains below a predefined threshold, and wherein the sealing layer has a thickness that is substantially equal to a thickness of the rail.

14. The data center of claim 13, wherein the containment system further includes:
a first set of rails that are coupled to the top of the at least one of the electronics racks and to the top structure;
a second set of rails that are coupled to the side of the first electronics rack and to the first side structure; and
a third set of rails that are coupled to the side of the second electronics rack and to the second side structure,
wherein each of the structures is arranged to move by sliding linearly along its respective set of rails.

15. The data center of claim 13, wherein the panel of the top structure extends at least along a width of the row, wherein the panel of each of the first and second side structures extends along a height of its respective electronics rack to which it is movably coupled.

16. The data center of claim 13, wherein the top structure comprises the at least one fan that is arranged to push air into or out of the containment region.

17. The data center of claim 16, wherein the axis is a first axis, wherein the at least one fan is arranged to rotate about a second axis that is perpendicular to the first axis to change a direction towards which the at least one fan pushes air.

18. The data center of claim 16, wherein the top structure further comprises the cooling unit that is arranged to produce cooled air from ambient air that is pulled from outside of the containment region by the at least one fan, wherein the cooled air is pushed into the containment region by the at least one fan.

19. The data center of claim 13,
wherein the cluster of electronics racks is a first cluster of electronics racks, wherein the data center further comprises a second cluster of electronics racks that are disposed within the data center IT room and are arranged in a second row that runs parallel and adjacent to the first cluster of electronics racks,
wherein each of the top, first side, and second side structures is arranged to move along the axis and towards the second cluster of electronics racks such that the containment region is at least partially surrounded by the first and second cluster of electronics racks and each of the top, first side, and second side structures.

20. The data center of claim 19, wherein the top structure is a first top structure, wherein the containment system is a first containment system, wherein the data center further comprises a second containment system that includes:
a second top structure that is disposed on top of the second cluster of electronics racks and is movably coupled on at least one of the electronics racks of the second cluster;
a third side structure that is movably coupled to a side of a third electronics rack that is positioned at the one end of the second row; and
a fourth side structure that is movably coupled to a side of a fourth electronics rack that is positioned at the another end of the second row that is opposite to the one end,
wherein 1) the first top structure, the first side structure, and the second side structure are arranged to move along the axis towards the second cluster of electronics racks and 2) the second top structure, the third side structure, and the fourth side structure are arranged to move along the axis towards the first cluster of electronics racks such that the first top structure, the first side structure, and the second side structure come into contact with the second top structure, the third side structure, and the fourth side structure, respectively, creating the containment region that is surrounded by the first and second clusters of electronics racks and all of the structures.

* * * * *